(12) United States Patent
Gunnam

(10) Patent No.: US 8,407,567 B2
(45) Date of Patent: Mar. 26, 2013

(54) RECONFIGURABLE ADDER

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 943 days.

(21) Appl. No.: 12/492,328

(22) Filed: Jun. 26, 2009

(65) Prior Publication Data

US 2010/0042903 A1 Feb. 18, 2010

Related U.S. Application Data

(63) Continuation of application No. 12/420,535, filed on Apr. 8, 2009.

(60) Provisional application No. 61/089,297, filed on Aug. 15, 2008.

(51) Int. Cl.
*H03M 13/45* (2006.01)

(52) U.S. Cl. .................................. 714/780

(58) Field of Classification Search .............. 714/780
See application file for complete search history.

(56) References Cited

U.S. PATENT DOCUMENTS

| | | | | |
|---|---|---|---|---|
| 3,260,840 A | * | 7/1966 | King .................... | 708/710 |
| 3,683,163 A | * | 8/1972 | Hanslip ................ | 708/518 |
| 4,021,655 A | * | 5/1977 | Healey et al. ......... | 708/518 |
| 4,437,165 A | * | 3/1984 | Onodera ............... | 708/518 |
| 4,536,855 A | * | 8/1985 | Morton ................ | 708/706 |
| 4,573,137 A | * | 2/1986 | Ohhashi ............... | 708/714 |
| 4,707,800 A | * | 11/1987 | Montrone et al. ... | 708/518 |
| 4,768,160 A | * | 8/1988 | Yokoyama .......... | 708/513 |
| 4,914,617 A | * | 4/1990 | Putrino et al. ........ | 708/706 |
| 5,081,607 A | * | 1/1992 | Bates et al. ........... | 708/710 |
| 5,189,636 A | * | 2/1993 | Patti et al. ............. | 708/706 |
| 5,327,369 A | * | 7/1994 | Ashkenazi ............ | 708/710 |
| 5,390,135 A | * | 2/1995 | Lee et al. .............. | 708/518 |
| 5,432,728 A | * | 7/1995 | Curtet .................. | 708/710 |
| 5,615,140 A | * | 3/1997 | Ishikawa .............. | 708/518 |
| 5,883,824 A | * | 3/1999 | Lee et al. .............. | 708/445 |
| 6,334,136 B1 | * | 12/2001 | Blomgren et al. ... | 708/710 |
| 6,449,629 B1 | * | 9/2002 | Morgan ............... | 708/518 |
| 6,560,625 B1 | * | 5/2003 | Rossignol et al. ... | 708/710 |

(Continued)

FOREIGN PATENT DOCUMENTS

WO WO 2010/019168 A1 2/2010

OTHER PUBLICATIONS

Rashvand, "Implementation of Microprocessors in Trellis Decoding of Convolutional Codes", Electronics Letters, vol. 18, No. 3, Feb. 4, 1982, pp. 121-123.*

(Continued)

*Primary Examiner* — Stephen M Baker
(74) *Attorney, Agent, or Firm* — Mendelsohn, Drucker & Associates, P.C.; Craig M. Brown; Steve Mendelsohn

(57) ABSTRACT

In one embodiment, a reconfigurable adder has first and second five-bit non-reconfigurable adders and is selectively configurable to operate in a five-bit mode or a ten-bit mode. In five-bit mode, the first non-reconfigurable adder adds first and second messages to generate a first sum, and the second non-reconfigurable adder adds third and fourth messages to generate a second sum. In ten-bit mode, the first non-reconfigurable adder adds a first half of a first ten-bit message and a first half of a second ten-bit message to generate a first partial sum and a carry-over bit. The second non-reconfigurable adder adds a second half of the first ten-bit message, a second half of the second ten-bit message, and the carry-over bit to generate a second partial sum. A ten-bit sum is then generated by combining the first and second partial sums.

20 Claims, 17 Drawing Sheets

U.S. PATENT DOCUMENTS

| | | | |
|---|---|---|---|
| 7,181,676 B2 | 2/2007 | Hocevar | |
| 7,219,118 B2* | 5/2007 | Wallace | 708/518 |
| 7,707,237 B2* | 4/2010 | Kuenemund | 708/630 |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0107181 A1 | 5/2006 | Dave et al. | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0124652 A1 | 5/2007 | Litsyn et al. | |
| 2007/0147481 A1 | 6/2007 | Bottomley et al. | |
| 2007/0162788 A1 | 7/2007 | Moelker | |
| 2007/0234178 A1 | 10/2007 | Richardson et al. | |
| 2007/0234184 A1 | 10/2007 | Richardson | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastra-Montano | |
| 2008/0235561 A1 | 9/2008 | Yang | |
| 2008/0276156 A1 | 11/2008 | Gunnam et al. | |
| 2008/0301521 A1 | 12/2008 | Gunnam et al. | |
| 2009/0273492 A1 | 11/2009 | Yang et al. | |
| 2010/0042806 A1 | 2/2010 | Gunnam | |
| 2010/0042890 A1 | 2/2010 | Gunnam | |

OTHER PUBLICATIONS

Vaghar et al, "An Analysis of Algorithms for Microprocessor Implementation of High-Speed Data Modems", IEEE ICASSP, 1985, pp. 1656-1659.*

Yeo et al, "Architectures and Implementations of Low-Density parity Check Decoding Algorithms", MWSCAS-2002, pp. III-437-III-440.*

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, Vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001, pp. 638-656, vol. 47, No. 2.

Tom Richardson—"Error Floors of LDPC Codes", IEEE Transactions on Information Theory, Feb. 2001, pp. 1426-1435, vol. 47, No. 2.

E. Papagiannis, C. Tjhai, M. Ahmed, M. Ambroze, M. Tomlinson— "Improved Iterative Decoding for Perpendicular Magnetic Recording", The ISCTA 2005 Conference on Feb. 4, 2005, pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics", Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963, pp. 90.

T. Richardson and R. Urbanke—"Modern Coding Theory", Cambridge University Press, Preliminary version—Oct. 18, 2007, pp. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299, vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002. pp. 404-412, vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547, vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698, vol. 41, No. 3.

Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix} \begin{matrix} \Big\} r=4 \end{matrix}$$

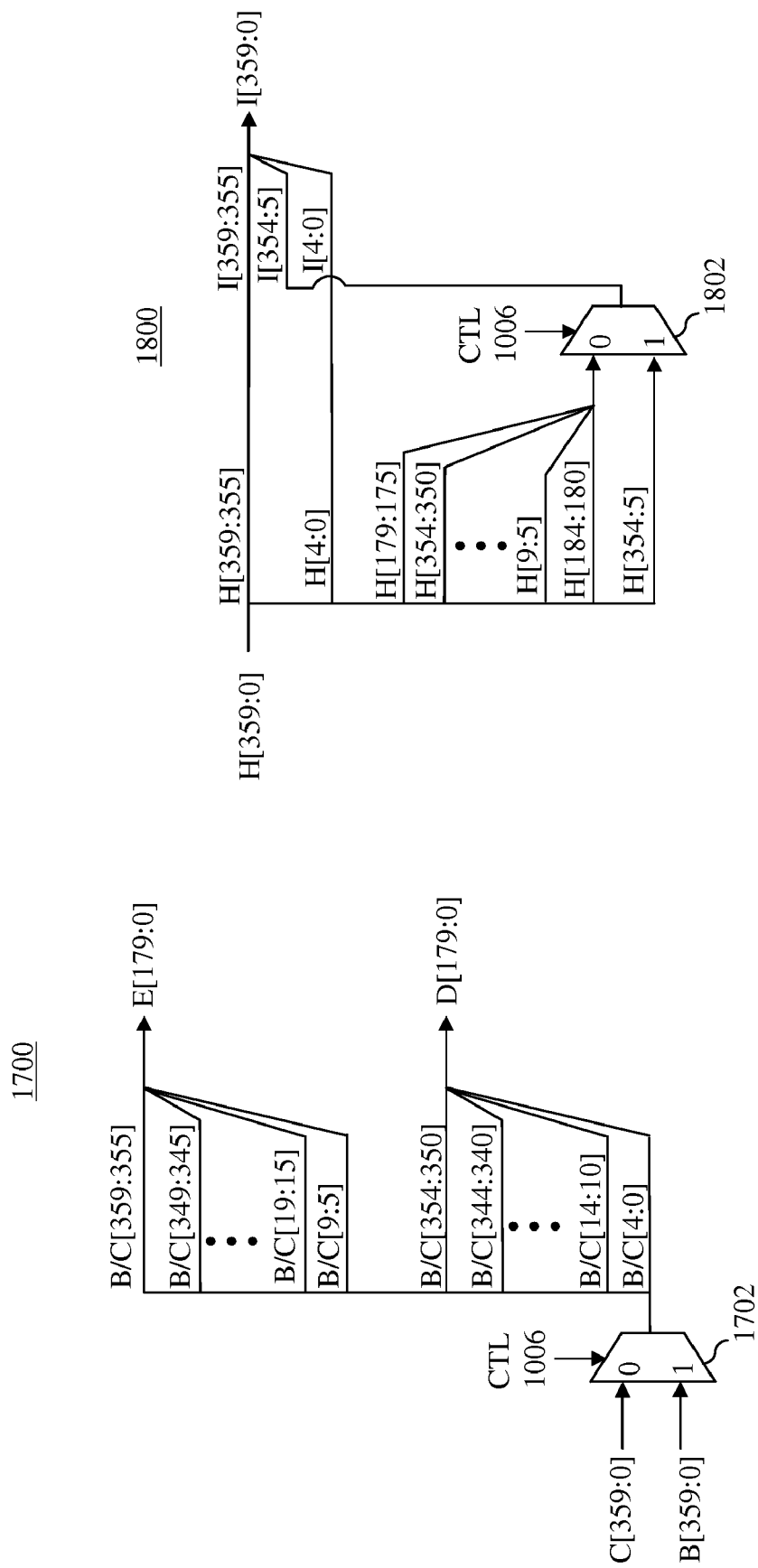

RECONFIGURABLE ADDER

CROSS-REFERENCE TO RELATED APPLICATIONS

This is a continuation of co-pending application Ser. No. 12/420,535, filed on Apr. 8, 2009, which claims the benefit of the filing date of U.S. provisional application No. 61/089,297, filed on Aug. 15, 2008, the teachings of both of which are incorporated herein by reference in their entirety.

The subject matter of this application is related to U.S. patent application Ser. No. 12/113,729 filed May 1, 2008, U.S. patent application Ser. No. 12/113,755 filed May 1, 2008, U.S. patent application Ser. No. 12/323,626 filed Nov. 26, 2008, U.S. patent application Ser. No. 12/401,116 filed Mar. 10, 2009, PCT patent application no. PCT/US08/86523 filed Dec. 12, 2008, and PCT patent application no. PCT/US08/86537 filed Dec. 12, 2008, the teachings all of which are incorporated herein by reference in their entirety.

The subject matter of this application is also related to PCT patent application no. PCT/US09/39918 filed Apr. 8, 2009, PCT application no. PCT/US09/39279 filed on Apr. 2, 2009, and U.S. patent application Ser. No. 12/420,535 filed Apr. 8, 2009.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In decoding a codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to break dominant trapping sets (i.e., trapping sets typically having the most significant influence on error floor characteristics). These dominant trapping sets vary widely based on the operating conditions of the decoder, such as decoder alphabet, decoder algorithm, decoder check-node unit update, channel conditions, and signal conditions.

SUMMARY OF THE INVENTION

In one embodiment, the present invention is an apparatus that comprises a reconfigurable adder. The reconfigurable adder, which is adapted to receive a first set of bits and a second set of bits, comprises a first non-reconfigurable adder, logic circuitry, and a second non-reconfigurable adder. The first non-reconfigurable adder is adapted to add (i) a first operand comprising a first subset of the first set of bits and (ii) a second operand comprising a first subset of the second set of bits to generate a first sum. The logic circuitry is adapted to receive (i) a mode control signal and (ii) a most significant bit (MSB) of the first sum and generate an intermediate value. The second non-reconfigurable adder adapted to add (i) a third operand comprising a second subset of the first set of bits, (ii) a fourth operand comprising a second subset of the second set of bits, and (iii) the intermediate value to generate a second sum. The reconfigurable adder is selectively configurable to operate in a first operating mode to add multi-bit values in a pair of multi-bit values, in which each multi-bit value has a first number of bits. Further, the reconfigurable adder is selectively configurable to operate in a second operating mode to add multi-bit values in a pair of multi-bit values, in which each multi-bit value has a second number of bits different from the first number of bits.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check matrix that may be used to implement a regular, quasi-cyclic (QC) low-density parity-check (LDPC) code;

FIG. 17 shows a simplified block diagram of a message separator according to one embodiment of the present invention that may be used to implement the message separator of the reconfigurable cyclic shifter of FIG. 14;

FIG. 18 shows a simplified block diagram of an output message reordering block according to one embodiment of the present invention that may be used to implement the output message reordering block of the reconfigurable cyclic shifter of FIG. 14.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Low-Density Parity Check (LDPC) Code

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, ..., r and c=10 columns of circulants (i.e., block columns) where k=1, ..., c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72× 10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 0, ..., 287, and each of the 720 columns corresponds to an $n^{th}$ variable node (also referred to as a bit node), where n ranges from 0, ..., 719. Further, each check node is connected to $w_r$=10 variable nodes as indicated by the 1s in a row, and each variable node is connected to $w_c$=4 check nodes as indicated by the 1s in a column. H-matrix 100 may be described as a regular LDPC code since all rows of H-matrix 100 have the same hamming weight $w_r$ and all columns of H-matrix 100 have the same hamming weight $w_c$.

Five-Bit LDPC Decoder

Figure 2:
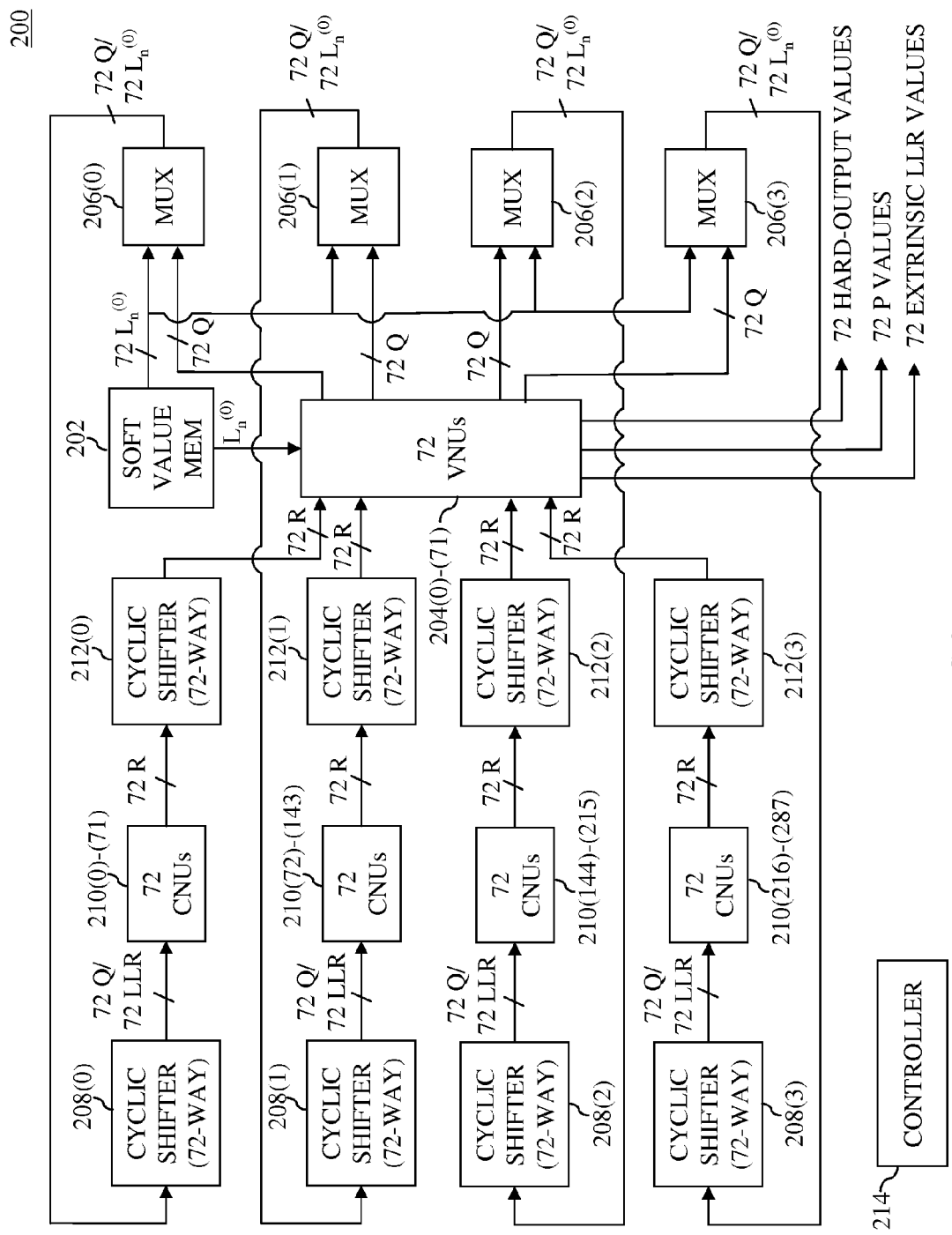
FIG. 2 shows a simplified block diagram of one implementation of an LDPC decoder that may be used to decode a signal encoded using an H-matrix such as the H-matrix of FIG. 1.

FIG. 2 shows a simplified block diagram of one implementation of an LDPC decoder 200 that may be used to decode codewords encoded using an H-matrix such as H-matrix 100 of FIG. 1. For each codeword received, LDPC decoder 200 receives 720 soft values (e.g., log-likelihood ratios (LLR)) $L_n^{(0)}$ from a soft detector such as a soft-output Viterbi detector and stores these soft values $L_n^{(0)}$ in soft-value memory 202. Each soft value $L_n^{(0)}$ corresponds to one bit of the codeword, and all of the soft values $L_n^{(0)}$ comprise the same (i.e., a fixed) number of bits. Each codeword is decoded iteratively using a message-passing algorithm, where all of the messages comprise the same (i.e., fixed) number of bits as the 720 soft values $L_n^{(0)}$. For this discussion, assume that each message, including each soft value $L_n^{(0)}$, comprises five bits.

In general, LDPC decoder 200 decodes the 720 soft values $L_n^{(0)}$ (i.e., messages) using a block-serial message-passing schedule. The messages are updated using (i) 288 five-bit check-node units (CNUs) 210, where each CNU 210 performs check-node updates for one row (i.e., the $m^{th}$ check node) of H-matrix 100 and (ii) 72 five-bit variable-node units (VNUs) 204, where each VNU 204 performs the variable-node updates for ten columns (i.e., the $n^{th}$ variable nodes) of H-matrix 100. CNUs 210(0), ..., 210(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 204(0), ..., 204(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. An iteration is complete after all check-node updates and variable-node updates have been performed.

Initially, the 720 five-bit soft values $L_n^{(0)}$ are provided to four multiplexers 206(0), ..., 206(3) at a rate of 72 soft values $L_n^{(0)}$ per clock cycle such that each multiplexer 206 receives all 72 soft values $L_n^{(0)}$ in the set. Each multiplexer 206 also receives 72 five-bit variable-node messages (herein referred to as Q messages) from VNUs 204(0), ..., 204(71), which are generated as discussed in further detail below. During the first iteration, multiplexers 206(0), ..., 206(3) select the sets of 72 five-bit soft values $L_n^{(0)}$ that they receive to output to 72-way cyclic shifters 208(0), ..., 208(3), respectively. The initial Q messages, which are not selected, may be Q messages generated for a previously considered codeword. During subsequent iterations, multiplexers 206(0), ..., 206(3) select the sets of 72 five-bit Q messages that they receive from VNUs 204(0), ..., 204(71) to output to 72-way cyclic shifters 208(0), ..., 208(3), respectively. For the following discussion, it will be understood that any reference to Q messages, applies to soft values $L_n^{(0)}$ during the first iteration.

Cyclic shifters 208(0), ..., 208(3) cyclically shift the sets of 72 five-bit Q messages that they receive based on a cyclic-shift signal that may be received from, for example, controller 214. The cyclic-shift signal corresponds to cyclic-shift factors of the circulants of H-matrix 100 of FIG. 1. For example, during the first clock cycle of an iteration, cyclic shifters 208(0), ..., 208(3) may shift their respective sets of 72 five-bit Q messages based on the shift factors of circulants $B_{1,1}$, $B_{2,1}$, $B_{3,1}$, and $B_{4,1}$ of H-matrix 100 of FIG. 1, respectively. During the second clock cycle of an iteration, cyclic shifters 208(0), . . . , 208(3) shift their respective sets of 72 five-bit Q messages based on the shift factors of circulants $B_{1,2}$, $B_{2,2}$, $B_{3,2}$, and $B_{4,2}$, respectively. Cyclic shifters 208(0), . . . , 208(3) then provide their respective 72 cyclically shifted five-bit Q messages to CNUs 210(0), . . . , 210(287), such that each CNU 210 receives a different one of the Q messages.

Figure 3:
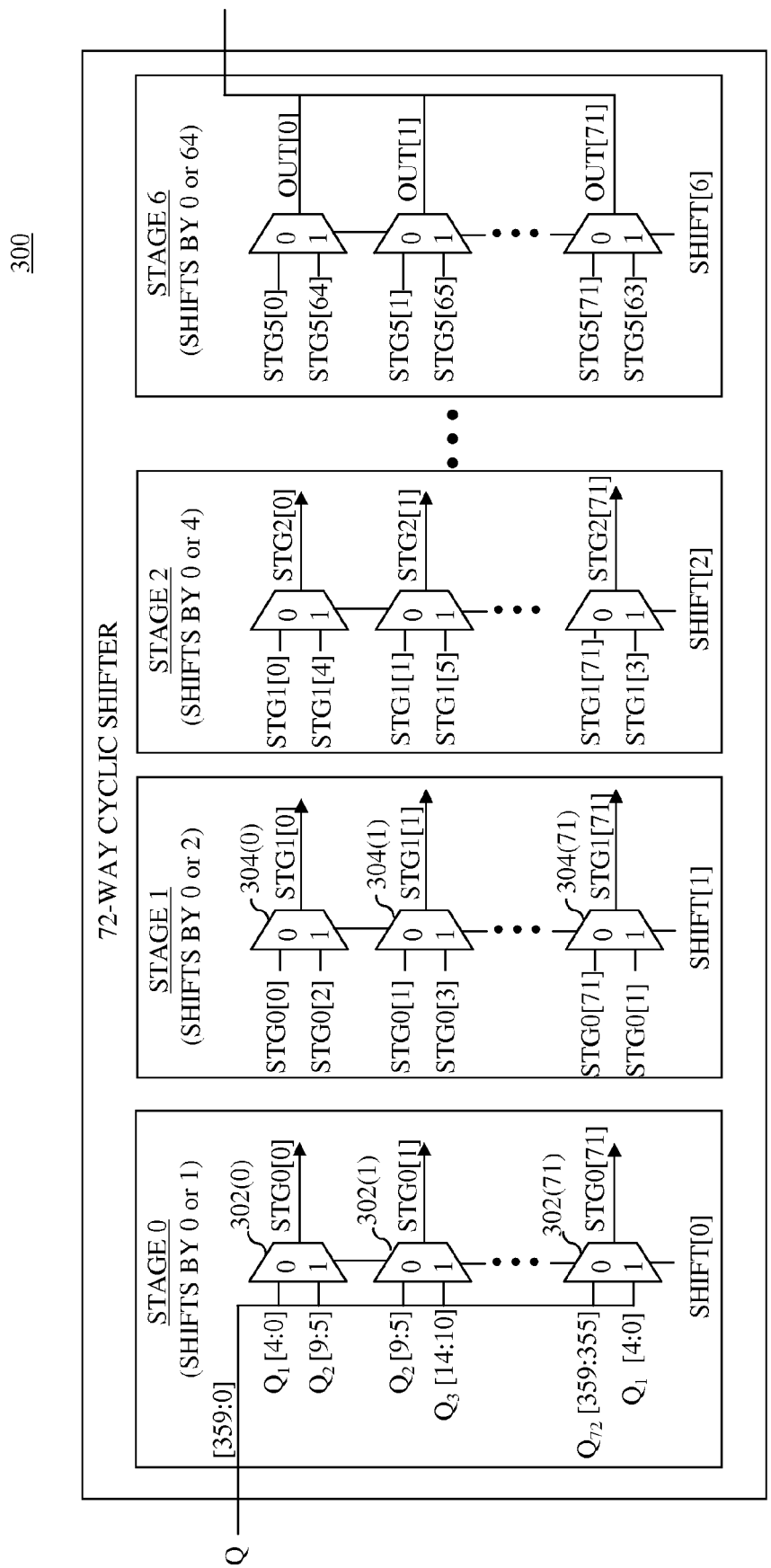
FIG. 3 shows a simplified block diagram of one implementation of a 72-way cyclic shifter that may be used to implement each cyclic shifter of FIG. 2.

FIG. 3 shows a simplified block diagram of one implementation of a 72-way cyclic shifter 300 that may be used to implement each of cyclic shifters 208(0), . . . , 208(3) of FIG. 2. Barrel shifter 300 has seven stages (i.e., Stages 0, . . . , 6), each of which is capable of providing two different shift factors based on a seven-bit cyclic-shift signal (e.g., SHIFT [0], . . . , SHIFT[6]) received from, for example, controller 214 of FIG. 2. Stage 0 is capable of shifting by a factor of 0 or 1, Stage 1 is capable of shifting by a factor of 0 or 2, Stage 2 is capable of shifting by a factor of 0 or 4, and so on, where Stage i is capable of shifting by a factor of 0 or $2^i$. Each stage comprises 72 multiplexers, which perform cyclic shifting based on the shift signal.

As an example of a shift operation, suppose that the desired shift factor is 3. This shift factor may be obtained by (i) asserting (i.e., setting equal to 1) the first and second bits (i.e., SHIFT[0] and SHIFT[1], respectively) of the cyclic-shift signal and (ii) deasserting (i.e., setting equal to 0) the third to seventh bits (i.e., SHIFT[2] to SHIFT[6], respectively) of the cyclic-shift signal such that the seven-bit cyclic-shift signal is equal to 1100000. Cyclic shifter 300 receives 72 five-bit messages (i.e., 360 bits). The five-bit messages are provided to multiplexers 302(0), . . . , 302(71) of Stage 0, such that (i) the upper inputs of multiplexers 302(0), . . . , 302(71) receive messages $Q_1$ (i.e., bits [4:0]), $Q_2$ (i.e., bits [9:5]), . . . , $Q_{72}$ (i.e., bits [359:355]), respectively, and (ii) the lower inputs of multiplexers 302(0), . . . , 302(71) receive messages $Q_2$ (i.e., bits [9:5]), . . . , $Q_{72}$ (i.e., bits [359:355]), and $Q_1$ (i.e., bits [4:0]), respectively. By asserting SHIFT[0], the lower input values of Stage 0 are output from multiplexers 302(0), . . . , 302(71) such that the input values are shifted by one.

The upper inputs of multiplexers 304(0), . . . , 304(71) of Stage 1 receive Stage 0 output values STG0[0], . . . , STG0[71], respectively, and the lower inputs of multiplexers 304 (0), . . . , 304(71) receive Stage 0 output values STG0[2], . . . , STG0[71], STG0[0], STG0[1], respectively. By asserting SHIFT[1], Stage 0 output values STG0[2], . . . , STG0[71], STG0[0], STG0[1] (i.e., the lower inputs of Stage 1), respectively, are output from multiplexers 304(0), . . . , 304(71), such that the Stage 0 output values are shifted by 2. The Stage 1 output values are then sequentially processed by Stages 2, . . . , 6, each of which provides a shift factor of 0.

Referring back to FIG. 2, each CNU 210 (i) receives a number of five-bit Q messages equal to the hamming weight $w_r$ of a row of H-matrix 100 (e.g., 10) at a rate of one Q message per clock cycle and (ii) generates $w_r$ five-bit check-node messages (herein referred to as R messages). Each R message may be generated using a suitable check-node algorithm, such as the offset min-sum algorithm, characterized by Equations (1), (2), and (3) shown below:

$$R_{mn}^{(i)} = \delta_{mn}^{(i)} \max(\kappa_{mn}^{(i)} - \beta, 0) \quad (1)$$

$$\kappa_{mn}^{(i)} = |R_{mn}^{(i)}| = \min_{n' \in N(m)/n} |Q_{n'm}^{(i-1)}| \quad (2)$$

$$\delta_{mn}^{(i)} = \left( \prod_{n' \in N(m)/n} \text{sign}(Q_{n'm}^{(i-1)}) \right). \quad (3)$$

where (i) $R_{mn}^{(i)}$ represents the R message corresponding to $m^{th}$ check node (i.e., row) and the $n^{th}$ variable node (i.e., column) of H-matrix 100 of FIG. 1 for the $i^{th}$ iteration, (ii) $Q_{nm}^{(i-1)}$ represents the Q message corresponding to the $n^{th}$ variable node and the $m^{th}$ check node of H-matrix 100 for the $(i-1)^{th}$ iteration, (iii) the function sign indicates that the multiplication operation (i.e., Π) is performed on the signs of the $Q_{nm}^{(i-1)}$ messages, and (iv) β is an offset value that varies with code parameters. Suppose that n' is a variable node in the set N(m)/n of all variable nodes connected to the $m^{th}$ check node except for the $n^{th}$ variable node (i.e., n'∈N(m)/n). The CNU 210, corresponding to the $m^{th}$ check node (i.e., row), generates message $R_{mn}^{(i)}$ based on all Q messages received during the previous $(i-1)^{th}$ iteration from the set N(m)/n. Thus, in the embodiment of FIG. 2, each R message is generated based on N(m)/n=nine Q messages (i.e., $w_r - 1 = 10 - 1$). Note that, for the first iteration, soft values $L_n^{(0)}$ received from soft-value memory 202 are used in Equations (2) and (3) in lieu of the Q messages for the prior iteration (i.e., $Q_{n'm}^{(0)} = L_{n'm}^{(0)}$).

The offset min-sum algorithm described in Equations (1), (2), and (3) may be simplified using a value-reuse technique. For example, during each iteration, each CNU 210 generates ten five-bit R messages, where each five-bit R message is generated using a set of N(m)/n=nine Q messages (one message is excluded as described above). For nine of these ten five-bit R messages, the minimum magnitude of the Q messages generated using Equation (2) will be the same. For one of these R messages, the minimum magnitude of the Q messages will be the second-smallest magnitude of the Q messages because the minimum magnitude of the Q messages will be excluded from the calculation as described above. Thus, it is not necessary to perform Equation (2) ten times for each CNU 210. Rather, each CNU 210 may store the two Q messages with the smallest magnitudes, and store an index value corresponding to the minimum magnitude that may be used to match the second-smallest magnitude with the correct R message (i.e., the R message that excludes the minimum magnitude).

Figure 4:
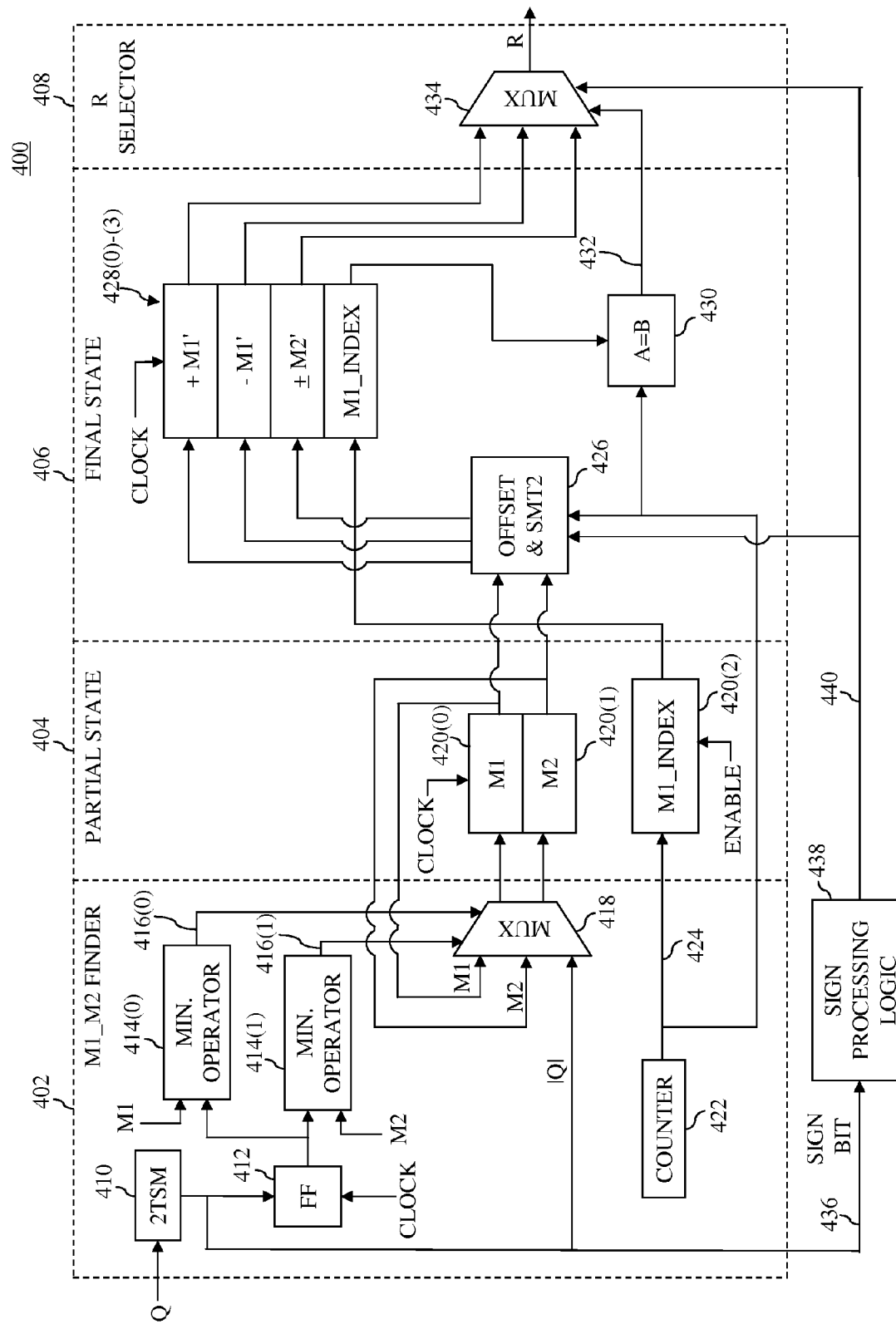
FIG. 4 shows a simplified block diagram of one implementation of a check-node unit (CNU) that may be used to implement each CNU of the LDPC decoder of FIG. 2.

FIG. 4 shows a simplified block diagram of one implementation of a CNU 400 that may be used to implement each CNU 210 of LDPC decoder 200 of FIG. 2. CNU 400 generates five-bit R messages using the offset min-sum algorithm described in Equations (1), (2), and (3) and the value reuse technique. The R messages are generated using a three-step process that may be performed over 22 clock cycles. During the first ten clock cycles of the $i^{th}$ iteration, CNU 400 receives ten five-bit Q messages, where one five-bit Q message is received during each clock cycle.

The ten five-bit Q messages are processed by M1_M2 finder 402, which determines the four-bit minimum (M1) and second minimum (M2) magnitudes of the ten Q messages and stores these values in partial state memory 404. In particular, during each of the first ten clock cycles, M1_M2 finder 402 receives a five-bit Q message in two's-complement format and generates a five-bit sign-magnitude value using two's-complement-to-sign-magnitude (2TSM) converter 410. The sign bit 436 of the sign-magnitude value is provided to sign processing logic 438, which (i) generates a product of the sign bits 436 of all ten Q messages and (ii) multiplies each Q sign bit 436 by the product to generate a different sign bit (i.e., sign bit 440) for each of the ten R messages. The four-bit magnitude |Q|[3:0] of the five-bit sign-magnitude value Q[4:0] is provided to multiplexer (MUX) 418 along with the four-bit minimum magnitude value M1 and the four-bit second minimum magnitude value M2 stored in partial state registers 420(0) and 420(1), respectively, of partial state memory 404. In addition, the four-bit magnitude value |Q|[3:0] is provided to flip-flop (FF) 412, which synchronizes the timing of CNU 400 with the clock signal of LDPC decoder 200.

Figure 5:
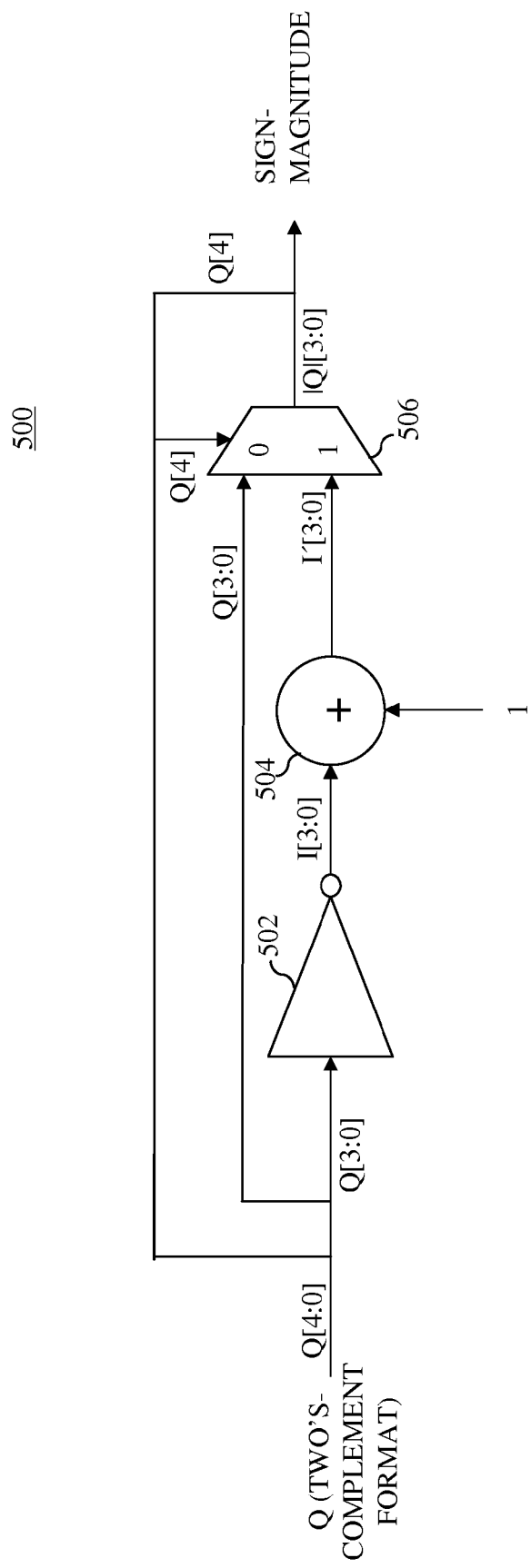
FIG. 5 shows a simplified block diagram of a two's-complement-to-sign-magnitude (2TSM) converter that may be used to implement the 2TSM converter of the CNU of FIG. 4.

FIG. 5 shows a simplified block diagram of a two's-complement-to-sign-magnitude (2TSM) converter 500 that may be used to implement 2TSM converter 410 of FIG. 4. 2TSM converter 500 receives a five-bit input Q message Q[4:0] in two's-complement format. The sign bit Q[4] is provided to the control port of MUX 506, and the remaining four bits Q[3:0] are provided to the upper input of MUX 506. In addition, the four remaining bits Q[3:0] are provided to inverter 502, which inverts all four bits. Adder 504 adds a value of 1 to the inverted bits I[3:0], and outputs a four-bit result I'[4:0] to the lower input of multiplexer 506. MUX 506 selects either the upper input Q[3:0] or the lower input I'[3:0] to output as four-bit magnitude value |Q|[3:0] based on the sign bit Q[4] of the input Q message. If the sign bit Q[4] has a value of 0, then the upper input Q[3:0] is output, and if the sign bit Q[4] has a value of 1, then the lower input I'[3:0] is output.

The input sign bit Q[4] and the four-bit magnitude value |Q|[3:0] represent the sign-magnitude value corresponding to the two's-complement input Q message Q[4:0]. For example, suppose that 2TSM converter 500 receives 00011 (+3 in two's-complement format). Since the sign bit Q[4] is 0, MUX 506 outputs magnitude value 0011, corresponding to the sign-magnitude value 00011. Now suppose that 2TSM converter 500 receives 11101 (−3 in two's-complement format). Inverter 502 inverts bits Q[3:0] bits 1101 to generate I[3:0] bits 0010, and adder 504 adds 1 to generate I'[3:0] bits 0011. Since the sign bit Q[4] is 1, MUX 506 outputs a magnitude value 0011, corresponding to the sign-magnitude value 10011.

Referring back to FIG. 4, minimum operator 414(0) compares the magnitude value |Q| to minimum magnitude value M1 stored in register 420(0). If the magnitude value |Q| is smaller than minimum magnitude value M1, then minimum operator 414(0) asserts control signal 416(0) (i.e., sets 416(0) equal to 1). Otherwise, minimum operator 414(0) de-asserts control signal 416(0) (i.e., sets 416(0) equal to 0). Similarly, minimum operator 414(1) compares the magnitude value |Q| to second minimum magnitude value M2 stored in register 420(1). If the magnitude value |Q| is smaller than M2, then control signal 416(1) is asserted. Otherwise, control signal 416(1) is de-asserted. To further understand the operation of MUX 418, consider the logic table of Table I for magnitude value |Q|.

TABLE I

Multiplexer 418 Logic Table

| Control Signal 416(0) | Control Signal 416(1) | Output to 420(0) | Output to 420(1) |
|---|---|---|---|
| 0 (|Q| ≧ M1) | 0 (|Q| ≧ M2) | M1 | M2 |
| 0 (|Q| ≧ M1) | 1 (|Q| < M2) | M1 | |Q| |
| 1 (|Q| < M1) | 0 (|Q| ≧ M2) | N/A | N/A |
| 1 (|Q| < M1) | 1 (|Q| < M2) | |Q| | M1 |

Table I shows that, if control signals 416(0) and 416(1) are both de-asserted (i.e., |Q|≧M1 and M2), then magnitude value |Q| is discarded, and the previously stored minimum and second minimum magnitude values M1 and M2 are stored in M1 register 420(0) and M2 register 420(1), respectively. If control signal 416(0) is de-asserted and control signal 416(1) is asserted (i.e., M2≧|Q|∝M1), then (i) minimum magnitude value M1 is stored in M1 register 420(0), (ii) magnitude value |Q| is stored in M2 register 420(1), and (iii) previously stored second minimum magnitude value M2 is discarded. If control signals 416(0) and 416(1) are both asserted (i.e., |Q|<M1 and M2), then (i) magnitude value |Q| is stored in M1 register 420(0), (ii) the previously stored minimum value M1 is stored in M2 register 420(1), and (iii) the second minimum value M2 is discarded. In addition to storing magnitude value |Q| in M1 register 420(0), M1_index register 420(2) is enabled, counter value 424 (generated by counter 422) corresponding to the new minimum value M1 is stored in M1_index register 420(2), and the counter value previously stored in M1_index register 420(2) is discarded. Note that it is not possible that control signal 416(0) will be asserted and control signal 416(1) will be de-asserted because this would indicate that the magnitude value |Q| is smaller than minimum magnitude value M1 but larger than second minimum magnitude value M2. Also, before the first clock cycle, the minimum and second minimum magnitude values M1 and M2 are initialized to suitably large values (e.g., binary 1111), and M1_index is initialized to 0.

After all ten Q messages have been considered, processing logic 426 of final state processor 406 offsets four-bit minimum magnitude value M1 and four-bit second minimum magnitude value M2 by offset value β as shown in Equation (1) to generate four-bit offset minimum magnitude value M1' and four-bit offset second minimum magnitude value M2'. Processing logic 426 converts four-bit offset minimum magnitude value M1' into a five-bit positive two's-complement value by appending a positive sign bit to four-bit value M1' and storing the five-bit result (+M1') in register 428(0). Processing logic 426 also converts four-bit offset minimum magnitude value M1' into a five-bit negative two's-complement value by appending a negative sign bit to four-bit value M1' and storing the five-bit result (−M1') in register 428(1). In addition, if sign bit 440 from sign processing logic 438 is a positive sign bit (0), then processing logic 426 converts four-bit offset second minimum magnitude value M2' into a five-bit positive two's-complement value (+M2') for storage in register 428(2). If sign bit 440 from sign processing logic 438 is a negative sign bit (1), then processing logic 426 converts four-bit offset second minimum magnitude value M2' into a five-bit negative two's-complement value (−M2') for storage in register 428(2). Processing logic 426 may convert four-bit offset second minimum magnitude value M2' to two's-complement format using hardware similar to 2TSM converter 500 of FIG. 5. Register 428(3) of final state processor 406 stores the counter value M1_INDEX from M1_index register 420(2).

During each of the next ten clock cycles, MUX 434 of R selector 408 outputs a five-bit R message based on (1) the positive value (+M1'), (2) the negative value (−M1'), (3) the positive or negative value (±M2'), (4) a comparison bit 432 from comparison operator 430, and (5) the corresponding sign bit 436 stored in sign processing logic 438. Each comparison bit 432 is generated by comparing current counter value 424 to the M1_index value stored in register 428(3). When the two are equal, comparison bit 432 is asserted, and when the two are not equal, comparison bit 432 is de-asserted. Each sign bit 440 may be generated as $\delta_{mn}^{(i)}$ using Equation (3), or alternatively, in the event that sign processing logic 438 is implemented using a FIFO, by multiplying a stored sign bit 436, as it is output from the FIFO, by the product of all sign bits 436 stored in sign processing logic 438. To further understand how R messages are output from MUX 434, consider the logic table of Table II.

TABLE II

Multiplexer 434 Logic Table

| Comparison Bit 432 | Sign Bit 440 | Output |
|---|---|---|
| 0 (A ≠ B) | 0 | +M1' |
| 0 (A ≠ B) | 1 | −M1' |
| 1 (A = B) | 0 | +M2' |
| 1 (A = B) | 1 | −M2' |

Table II shows that, if both comparison bit 432 and sign bit 440 are de-asserted, then the positive value (+M1') stored in register 428(0) will be output as the five-bit R message. If comparison bit 432 is de-asserted and sign bit 440 is asserted, then the negative value (−M1') stored in register 428(1) will be output as the five-bit R message. If comparison bit 432 is asserted and sign bit 440 is de-asserted, then the positive value (+M2') will have been stored in register 428(2) and will now be output as the five-bit R message. If both comparison bit 432 and sign bit 440 are asserted, then the negative value (−M2') will have been stored in register 428(3) and will now be output as the five-bit R message.

Referring back to FIG. 2, cyclic shifters 212(0), ..., 212(3) cyclically shift the sets of 72 five-bit R messages that they receive according to the cyclic shifts of the circulants $B_{j,k}$ of H-matrix 100 of FIG. 1, which may be provided by controller 214. Essentially, cyclic shifters 212(0), ..., 212(3) reverse the cyclic shifting of cyclic shifters 208(0), ..., 208(3). This may be accomplished by using a cyclic shifter similar to that of cyclic shifter 300 of FIG. 3. However, rather than cyclically shifting the messages up as is performed by cyclic shifter 300, cyclic shifter 212(0), ..., 212(3) may cyclic shift the messages down. Cyclic shifters 212(0), ..., 212(3) then provide the 4×72 cyclically shifted five-bit R messages to VNUs 204(0), ..., 204(71), such that each VNU 204 receives four of the R messages, one from each cyclic shifter 212. Each VNU 204 then updates each of the four five-bit Q messages that it generates as shown in Equation (4):

$$Q_{nm}^{(i)} = L_n^{(0)} + \sum_{m' \in M(n)/m} R_{m'n}^{(i-1)}, \quad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i−1)^{th}$ iteration from the set M(n)/m and (ii) an initial soft value $L_n^{(0)}$ received from soft value memory 202 that corresponds to the $n^{th}$ variable node. Each VNU 204 outputs the four updated five-bit Q messages that it generates, such that a different one of the four messages is provided to a different corresponding MUX 206.

In addition to outputting four updated five-bit Q messages, each VNU 204 outputs (i) a seven-bit extrinsic LLR value, (ii) a hard-decision output bit, and (iii) an eight-bit P value. Each seven-bit extrinsic LLR value may be represented as shown in Equation (5):

$$\text{Extrinsic Value}_n = \sum_{m \in M(n)} R_{mn}^{(i)}, \quad (5)$$

where m is a check node in the set M(n) of all check nodes connected to the $n^{th}$ variable node (i.e., m∈M(n)). Each eight-bit P value may be generated using Equation (6) as follows:

$$P_n = L_n^{(0)} + \sum_{m \in M(n)} R_{mn}^{(i)}, \text{ and} \quad (6)$$

each hard-decision bit $\hat{x}_n$ may be generated based on Equations (7) and (8) below:

$$\hat{x}_n = 0 \text{ if } P_n \geq 0 \quad (7)$$

$$\hat{x}_n = 1 \text{ if } P_n < 0 \quad (8)$$

$P_n$ is determined for each variable node by adding the extrinsic value from Equation (5) to the initial soft value $L_n^{(0)}$ received from soft-value memory 202 that corresponds to the $n^{th}$ variable node. If $P_n$ is greater than or equal to zero, then the hard-decision bit $\hat{x}_n$ is set equal to zero, as shown in Equation (7). If $P_n$ is less than zero, then the hard-decision bit $\hat{x}_n$ is set equal to one, as shown in Equation (8).

A parity check is then performed, for example, by controller 214, using the hard-decision values to determine whether the decoding process is finished. In particular, if $\hat{x}H^T=0$, where $H^T$ is the transpose of H-matrix 100 of FIG. 1 and $\hat{x}$ is a 720-element vector formed from 720 hard-decision bits $\hat{x}_n$, output during ten clock cycles, then the decoding process is finished. If $\hat{x}H^T \neq 0$, then a subsequent iteration is performed to generate a new set of extrinsic LLR values, P values, and hard decisions. If the decoding process does not end within a predefined number of iterations, then the decoding process is terminated and the received codeword has not been properly decoded.

Figure 6:
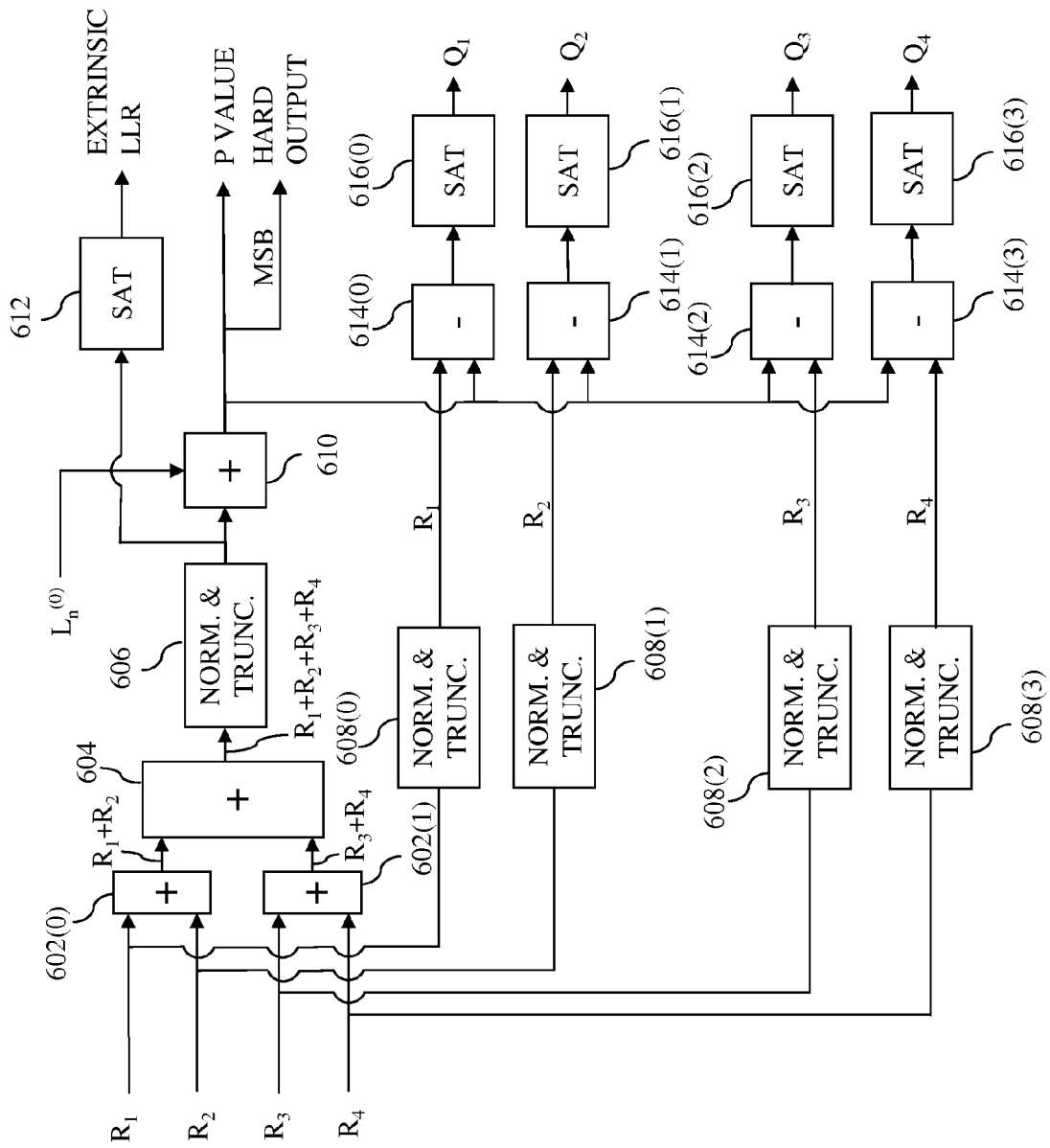
FIG. 6 shows a simplified block diagram of one implementation of a variable-node unit (VNU) that may be used to implement each VNU of the LDPC decoder of FIG. 2.

FIG. 6 shows a simplified block diagram of one implementation of a VNU 600 that may be used to implement each VNU 204 of LDPC decoder 200 of FIG. 2. During each iteration, except for the initial iteration, VNU 600 receives four five-bit R messages $R_1$, $R_2$, $R_3$, and $R_4$ and a five-bit soft value $L_n^{(0)}$ and generates (i) four five-bit Q messages $Q_1$, $Q_2$, $Q_3$, $Q_4$, (ii) a five-bit P value, (iii) a hard-decision output value $\hat{x}_n$, and (iv) a five-bit extrinsic LLR value. Initially, the four five-bit R messages $R_1$, $R_2$, $R_3$, and $R_4$, received in two's-complement format, are added together to generate the five-bit extrinsic LLR value as shown in Equation (5) using two adder stages. The first adder stage comprises (i) adder 602(0), which adds messages $R_1$ and $R_2$ (i.e., $R_1+R_2$), and (ii) adder 602(1), which adds messages $R_3$ and $R_4$ (i.e., $R_3+R_4$). The second adder stage comprises adder 604, which adds (i) the sum of messages $R_1$ and $R_2$ to (ii) the sum of messages $R_3$ and $R_4$ to generate the extrinsic LLR value (i.e., $R_1+R_2+R_3+R_4$).

The seven-bit extrinsic LLR value may be normalized and truncated (NORM & TRUNC component 606), saturated (SAT component 612), and output from VNU 600. Normalization and truncation component 606 and saturation component 612 are employed to ensure that the number of bits used to represent a message remains constant. Normalization may be applied, for example, by dividing a message by a factor of two. Truncation may be applied, for example, by deleting the least significant bit (LSB). Saturation may be performed to maintain a message within a specified range, such that if the message is out of the specified range, the message is mapped to a value within the specified range.

The normalized, truncated extrinsic LLR value is also used to generate a P value and hard-decision output value $\hat{x}_n$. In particular, the normalized, truncated extrinsic LLR value is provided to a third adder stage that comprises adder 610. Adder 610 generates an eight-bit value P as shown in Equation (6) by adding the normalized, truncated extrinsic LLR value to the five-bit soft value $L_n^{(0)}$ (i.e., $P=R_1+R_2+R_3+R_4+L_n^{(0)}$). The sign bit (i.e., the most-significant bit) of P is then used to generate the hard-decision value $\hat{x}_n$. If the sign bit of P is 0, then P≧0 and the hard-decision value is 0, as shown in Equation (7). If the sign bit of P is 1, then P<0 and the hard-decision value is 1, as shown in Equation (8).

The four five-bit R messages $R_1$, $R_2$, $R_3$, and $R_4$ are also normalized and truncated (components 608(0), ..., 608(3)) and provided to a fourth adder stage comprising adders 614(0), ..., 614(3), such that each normalized, truncated R message is provided to a different adder 614. Each adder 614 generates a Q message as shown in Equation (4) based on (i) the R message that it receives and (ii) the value P generated by adder 610. In particular, message $Q_1$ is generated by subtracting message $R_1$ from P (i.e., $Q_1=R_1+R_2+R_3+R_4+L_n^{(0)}-R_1$), message $Q_2$ is generated by subtracting message $R_2$ from P (i.e., $Q_2=R_1+R_2+R_3+R_4+L_n^{(0)}-R_2$), message $Q_3$ is generated by subtracting message $R_3$ from P (i.e., $Q_3=R_1+R_2+R_3+R_4+L_n^{(0)}-R_3$), and message $Q_4$ is generated by subtracting message $R_4$ from P (i.e., $Q_4=R_1+R_2+R_3+R_4+L_n^{(0)}-R_4$). Messages $Q_1$, $Q_2$, $Q_3$, and $Q_4$ may then be saturated (SAT component 616(0), . . . , 616(3)) in a manner similar to that described above in relation to SAT component 612 and output as five-bit Q messages. Note that each VNU 204 may also be implemented using fewer adder stages than that of VNU 600 as taught in U.S. patent application Ser. No. 12/323,626 filed Nov. 26, 2008, the teachings of which are incorporated herein by reference in their entirety.

Figure 7:
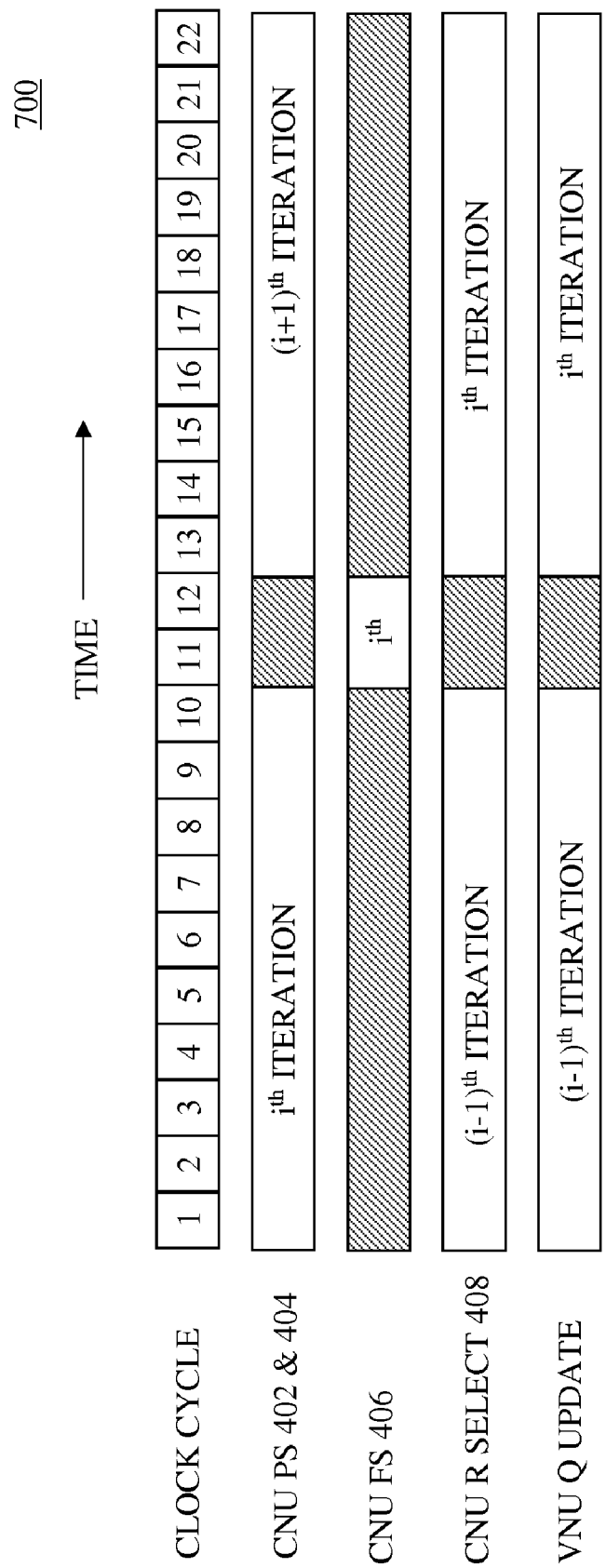
FIG. 7 graphically illustrates a timing diagram for the LDPC decoder of FIG. 2.

FIG. 7 graphically illustrates a timing diagram 700 for LDPC decoder 200 of FIG. 2. For this diagram, suppose that LDPC decoder 200 implements CNUs such as CNU 400 of FIG. 4. As shown, during the first ten clock cycles of the $i^{th}$ iteration, partial state (PS) processing (e.g., 404) of each CNU 210 generates and stores minimum magnitude value M1 and second minimum magnitude value M2. During the $11^{th}$ and $12^{th}$ iterations, final state (FS) processing (e.g., 406) of each CNU 210 generates and stores the (1) positive value (+M1'), (2) the negative value (−M1'), and (3) the positive or negative value (±M2'). During the $13^{th}$ to $22^{nd}$ clock cycles, R selector 408 of each CNU 210 selects and outputs the updated five-bit R messages to VNUs 204(0), . . . , 204(71), which generate the updated five-bit Q messages during the same ten clock cycles. Note that cyclic shifters 208(0), . . . , 208(3), cyclic shifters 212(0), . . . , 212(3), and multiplexers 206(0), . . . , 206(3) merely direct the messages to the corresponding CNUs 210 or VNUs 204, and consequently, they add insignificant delays to the timing diagram. Further, note that, since partial state processing 404 and final state processing 406 of each CNU 210 are performed during different sets of clock cycles, each CNU 210 may process portions of two different iterations at the same time. For example, during the $13^{th}$ to $22^{nd}$ clock cycles, as R selector 408 selects and outputs the updated five-bit R messages to VNUs 204(0), . . . , 204(71) for the $i^{th}$ iteration, partial state processing 404 may be implemented for the $(i+1)^{th}$ iteration.

Error-floor characteristics of an LDPC decoder may be improved by changing the decoder alphabet. The decoder alphabet refers to characteristics of the messages processed by the LDPC decoder including, for example, number of bits per message, dynamic range, resolution and saturation, truncation, rounding methods, whether the messages are represented as fixed point or floating point, and whether the messages have uniform or non-uniform quantization. Typically, the trapping sets for a particular decoder alphabet are different from those of other decoder alphabets. Thus, different trapping sets may be obtained by, for example, changing the number of bits used to represent the LDPC decoder messages (i.e., changing the decoder precision). In particular, increasing the decoder precision (i.e., increasing the number of bits) typically lowers the impact of trapping sets, thereby improving error-floor characteristics. However, increasing the decoder precision also typically decreases the throughput of the LDPC decoder.

One method to achieve the advantages of both a lower-precision decoder (e.g., higher throughput) and a higher-precision decoder (e.g., improved error-floor characteristics) is to construct a reconfigurable LDPC decoder that is capable of selectively processing messages of two or more different precisions. For example, a reconfigurable LDPC decoder may be constructed with two distinct sets of hardware: one set of hardware that decodes codewords using five-bit messages and another set of hardware that decodes codewords using ten-bit messages. Normally, the LDPC decoder may be operated in a five-bit precision mode that processes five-bit messages to achieve a higher throughput. If the LDPC decoder is unable to correctly decode codewords due to one or more trapping sets, then the decoder is changed in real time to a ten-bit precision mode that processes ten-bit messages, in order to improve the probability that the codewords will be decoded correctly.

Instead of implementing two distinct sets of hardware, chip area can be reduced by implementing a reconfigurable LDPC decoder according to an exemplary embodiment of the present invention using a single set of hardware that may be selectively reconfigured in real time to process either five-bit messages or ten-bit messages. The chip area for such an implementation may be approximately the same as that for a single ten-bit decoder. To further understand how reconfigurable LDPC decoders of the present invention may be implemented, one exemplary embodiment is discussed below.

Reconfigurable LDPC Decoder

Figure 8:
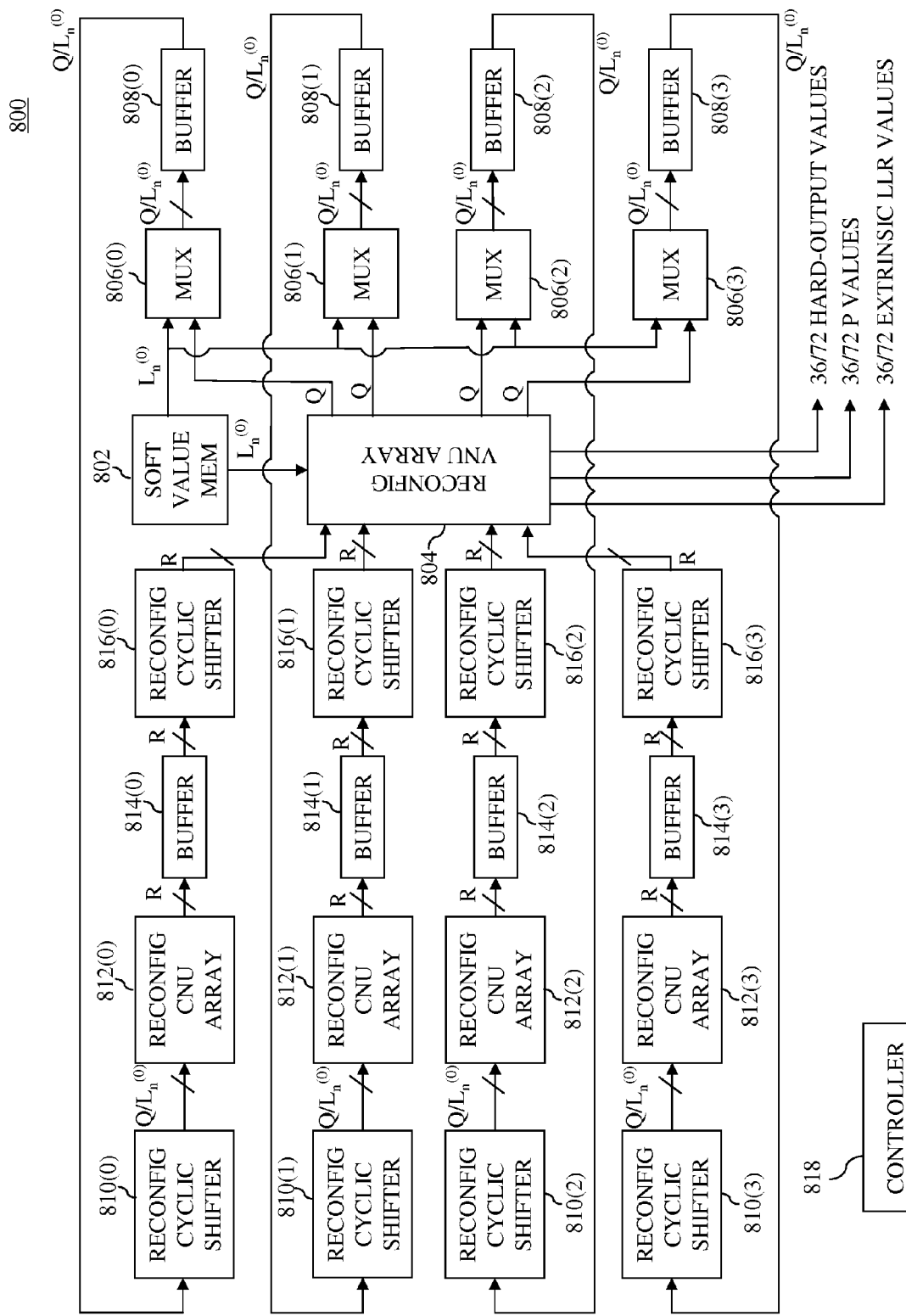
FIG. 8 shows a simplified block diagram of an LDPC decoder according to one embodiment of the present invention that may be used to decode a signal encoded using an H-matrix such as the H-matrix 100 of FIG. 1.

FIG. 8 shows a simplified block diagram of an LDPC decoder 800 according to one embodiment of the present invention, which may be used to decode codewords encoded using an H-matrix such as H-matrix 100 of FIG. 1. LDPC decoder 800 has reconfigurable variable-node unit (VNU) array 804, reconfigurable cyclic shifters 810(0), . . . , 810(3) and 816(0), . . . , 816(3), and reconfigurable check-node unit (CNU) arrays 812(0), . . . , 812(3), all of which may be reconfigured in real time to process either five-bit messages in a five-bit precision mode or ten-bit messages in a ten-bit precision mode. In one possible implementation of LDPC decoder 800, reconfigurable VNU array 804 comprises 36 reconfigurable VNUs, each of which may be configured as (i) two five-bit VNUs in five-bit precision mode for a total of 72 VNUs or (ii) one ten-bit VNU in ten-bit precision mode for a total of 36 VNUs.

In addition, reconfigurable shifters 810(0), . . . , 810(3) and 816(0), . . . , 816(3) may each be configured as (i) a 72-by-72 five-bit cyclic shifter in five-bit precision mode that shifts 72 five-bit messages per clock cycle or (ii) a 72-by-72 ten-bit cyclic shifter in ten-bit precision mode that shifts 36 ten-bit messages per clock cycle. Furthermore, each reconfigurable CNU array 812 comprises 36 reconfigurable CNUs, each of which may be configured as (i) two five-bit CNUs in five-bit precision mode or (ii) two ten-bit CNUs in ten-bit precision mode, such that, in both modes, each reconfigurable CNU array 812 may be configured as a total of 72 CNUs. In five-bit precision mode, each reconfigurable CNU performs the updates for two check nodes (i.e., rows) at the same time. In ten-bit precision mode, each reconfigurable CNU performs the updates for two check nodes (i.e., rows) such that the updates alternate in time (i.e., updates for the first row are performed, followed by updates for the second row, followed by updates for the first row, and so on). Exemplary embodiments of these reconfigurable components are provided below in relation to FIGS. 9-18.

In general, in the five-bit precision mode, LDPC decoder 800 receives 720 five-bit soft values $L_n^{(0)}$ from a soft detector such as a soft-output Viterbi detector and stores these soft values $L_n^{(0)}$ in soft-value memory 802. The 720 five-bit soft values $L_n^{(0)}$ are decoded iteratively in five-bit precision mode in a manner similar to that of LDPC decoder 200 of FIG. 2 using a block-serial message-passing schedule. In so doing, reconfigurable CNU arrays 812(0), . . . , 812(3), each configured as 72 five-bit CNUs, perform the check-node (i.e., row) updates for the 288 rows of H-matrix 100, one block column at a time. For example, reconfigurable CNU arrays 812(0), ..., 812(3) perform the check-node updates for circulants $B_{1,1}$, $B_{2,1}$, $B_{3,1}$, and $B_{4,1}$, respectively, followed by the check-node updates for circulants $B_{1,2}$, $B_{2,2}$, $B_{3,2}$, and $B_{4,2}$, respectively, followed by the check-node updates for $B_{1,3}$, $B_{2,3}$, $B_{3,3}$, and $B_{4,3}$, respectively, and so forth. Reconfigurable VNU array 804, configured as 72 five-bit VNUs, then performs the variable-node (i.e., column) updates for the 720 columns of H-matrix 100, one block column at a time. For example, reconfigurable VNU array 804 performs the variable-node updates for circulants $B_{1,1}$, $B_{2,1}$, $B_{3,1}$, and $B_{4,1}$, followed by the variable-node updates for circulants $B_{1,2}$, $B_{2,2}$, $B_{3,2}$, and $B_{4,2}$, followed by the variable-node updates for $B_{1,3}$, $B_{2,3}$, $B_{3,3}$, and $B_{4,3}$, and so forth. Similar to LDPC decoder 200 of FIG. 2, an iteration of the five-bit precision mode is complete after all check-node updates and variable-node updates have been performed. Note that buffers 808(0), ..., 808(3) and 814(0), ..., 814(3) need not be used in the five-bit precision mode.

If LDPC decoder 800 is not able to correctly decode the codeword in the five-bit precision mode, then the soft Viterbi detector is instructed to generate and provide 720 ten-bit soft values $L_n^{(0)}$, which are subsequently stored in soft-value memory 802. LDPC decoder 800 is then reconfigured into the ten-bit precision mode in real time, and the 720 ten-bit soft values $L_n^{(0)}$ are decoded using a modified block-serial message-passing schedule. In so doing, the check-node (i.e., row) updates for H-matrix 100 of FIG. 1 are performed one-half of a block column at a time. For example, CNU arrays 812(0), ..., 812(3) perform the check-node updates for the first half (i.e., the first 36 rows) of each circulant in the first block column (i.e., the first half of circulants $B_{1,1}$, $B_{2,1}$, $B_{3,1}$, and $B_{4,1}$), respectively, followed by the check-node updates for the second half (i.e., the second 36 rows) of each circulant in the first block column, respectively, followed by the first half (i.e., the first 36 rows) of each circulant in the second block column (i.e., the first half of circulants $B_{1,2}$, $B_{2,2}$, $B_{3,2}$, and $B_{4,2}$), respectively, followed by the check-node updates for the second half (i.e., the second 36 rows) of each circulant in the second block column, respectively, and so forth. The variable-node (i.e., column) updates for H-matrix 100 are then performed one-half of a block column at a time. For example, reconfigurable VNU array 804 performs the variable-node updates for the first half (i.e., the first 36 columns) of the first block column (i.e., circulants $B_{1,1}$, $B_{2,1}$, $B_{3,1}$, and $B_{4,1}$), followed by the variable-node updates for the second half (i.e., the second 36 columns) of the first block column, followed by the variable-node updates for the first half (i.e., the first 36 columns) of the second block column (i.e., circulants $B_{1,2}$, $B_{2,2}$, $B_{3,2}$, and $B_{4,2}$), followed by the variable-node updates for the second half (i.e., 36 columns) of the second block column, and so forth. An iteration, which is performed over approximately twice as many clock cycles as an iteration of the five-bit precision mode, is complete after all check-node updates and variable-node updates have been performed.

Initially, in ten-bit precision mode, the 720 ten-bit soft values $L_n^{(0)}$ are provided, 36 soft values $L_n^{(0)}$ per clock cycle, to four multiplexers (MUX) 806(0), ..., 806(3), such that each multiplexer 806 receives all 36 ten-bit soft values $L_n^{(0)}$. Each multiplexer 806 also receives 36 ten-bit variable-node messages (herein referred to as Q messages) from reconfigurable VNU array 804, which are generated as discussed in further detail below. During the first iteration, multiplexers 806(0), ..., 806(3) select the sets of 36 ten-bit soft values $L_n^{(0)}$ that they receive to output to buffers 808(0), ..., 808(3), respectively. The initial Q messages, which are not output during the first iteration, may be Q messages generated for a previously considered codeword. During subsequent iterations, multiplexers 806(0), ..., 806(3) select the sets of 36 ten-bit Q messages that they receive from reconfigurable VNU array 804 to output to buffers 808(0), ..., 808(3), respectively. For the following discussion, it will be understood that any reference to Q messages, applies to soft values $L_n^{(0)}$ during the first iteration. Each buffer 808 accumulates 72 ten-bit Q messages at a rate of 36 ten-bit Q messages per clock cycle. Once 72 Q messages have been received, the buffer 808 outputs the 72 ten-bit Q messages to its corresponding reconfigurable cyclic shifter 810 and begins receiving a new set of 72 Q messages.

Reconfigurable cyclic shifters 810(0), ..., 810(3) cyclically shift the sets of 72 ten-bit Q messages that they receive, 36 ten-bit Q messages at a time, based on a cyclic-shift signal that may be received from, for example, controller 818, and provide their cyclically shifted values to reconfigurable CNU arrays 812(0), ..., 812(3), respectively. The cyclic-shift signal corresponds to cyclic-shift factors of the circulants of H-matrix 100 of FIG. 1. For example, during the first clock cycle of an iteration, reconfigurable cyclic shifters 810(0), ..., 810(3) may shift 36 of the 72 ten-bit Q messages that they receive from buffers 808(0), ..., 808(3), respectively, based on the shift factors of the first 36 rows of circulants $B_{1,1}$, $B_{2,1}$, $B_{3,1}$, and $B_{4,1}$ of H-matrix 100 of FIG. 1, respectively. During the second clock cycle, reconfigurable cyclic shifters 810(0), ..., 810(3) may shift 36 of the 72 ten-bit Q messages that they receive from buffers 808(0), ..., 808(3), respectively, based on the shift factors of the second 36 rows of circulants $B_{1,1}$, $B_{2,1}$, $B_{3,1}$, and $B_{4,1}$, respectively. During the third clock cycle, reconfigurable cyclic shifters 810(0), ..., 810(3) may shift 36 of the 72 ten-bit Q messages that they receive from multiplexers 806(0), ..., 806(3), respectively, based on the shift factors of the first 36 rows of circulants $B_{1,2}$, $B_{2,2}$, $B_{3,2}$, and $B_{4,2}$, respectively. During the fourth clock cycle, reconfigurable cyclic shifters 810(0), ..., 810(3) may shift 36 of the 72 ten-bit Q messages that they receive from buffers 808(0), ..., 808(3), respectively, based on the shift factors of the second 36 rows of circulants $B_{1,2}$, $B_{2,2}$, $B_{3,2}$, and $B_{4,2}$, respectively. In this manner, all 720 ten-bit Q messages are cyclically shifted during the first 20 clock cycles of an iteration.

Each reconfigurable CNU of each reconfigurable CNU array 812 performs the updates for two check nodes (i.e., rows) such that the updates alternate in time (i.e., updates for the first row are performed, followed by updates for the second row, followed by updates for the first row, and so on). In so doing, each reconfigurable CNU receives a number of ten-bit Q messages equal to the hamming weight $w_r$ of two rows of H-matrix 100 (e.g., 2×10=20) at a rate of one Q message per clock cycle. The messages received during the odd-numbered clock cycles (i.e., 1, 3, ..., 19) correspond to a first check node (i.e., row), and the messages received during the even-numbered clock cycles (i.e., 2, 4, ..., 20) correspond to a second check node (i.e., row). Each reconfigurable CNU then generates $2 \times w_r$ ten-bit check-node messages (herein referred to as R messages) at a rate of one R message per clock cycle using a suitable check-node algorithm, such as the offset min-sum algorithm, characterized by Equations (1), (2), and (3). Each R message generated during an odd-numbered clock cycle is based on nine of the ten R messages received during the odd-numbered clock cycles, and each R message generated during an even-numbered clock cycle is based on nine of the ten R messages received during the even-numbered clock cycles. Similar to CNUs 210(0), ..., 210(287) of FIG. 2, the R messages may be generated using a value-reuse technique.

The R messages generated by reconfigurable CNU arrays 812(0), ..., 812(3) are provided to buffers 814(0), ..., 814(3), respectively. In a manner similar to buffers 808(0), ..., 808(3), each buffer 814 accumulates 72 ten-bit R messages at a rate of 36 ten-bit R messages per clock cycle. Once 72 R messages have been received, the buffer 814 outputs the 72 ten-bit R messages to its corresponding reconfigurable cyclic shifter 816 and begins receiving a new set of 72 R messages. Each reconfigurable cyclic shifter 816 receives 72 ten-bit R messages at a time and cyclically shifts 36 of the 72 R messages at a time according to the cyclic shifts of the circulants of H-matrix 100 of FIG. 1, which may be provided by controller 818.

Reconfigurable cyclic shifters 816(0), ..., 816(3) provide the sets of 4×36 cyclically shifted R messages to reconfigurable VNU array 804, which comprises 36 reconfigurable VNUs, where each is configured as one ten-bit VNU (i.e., for a total of 36 VNUs). The 4×36 cyclically shifted R messages are provided such that each reconfigurable VNU receives four of the R messages. Each reconfigurable VNU performs the four updates for one variable node (i.e., column) of H-matrix 100 of FIG. 1 to generate four updated ten-bit Q messages in a manner similar to that discussed above in relation to Equation (4). In addition each reconfigurable VNU generates (i) a 12-bit extrinsic LLR value, (ii) a hard-decision output bit, and (iii) a 13-bit P value in a manner similar to that discussed above in relation to Equations (5) through (8). A parity check is then performed using the hard-decision values in a manner similar to that discussed above in relation to LDPC decoder 200 of FIG. 2.

To further understand the operation of the reconfigurable components of LDPC decoder 800, one embodiment of a reconfigurable CNU, one embodiment of a reconfigurable VNU, and one embodiment of a reconfigurable cyclic shifter are discussed below.

Reconfigurable Check-Node Unit (CNU)

Figure 9:
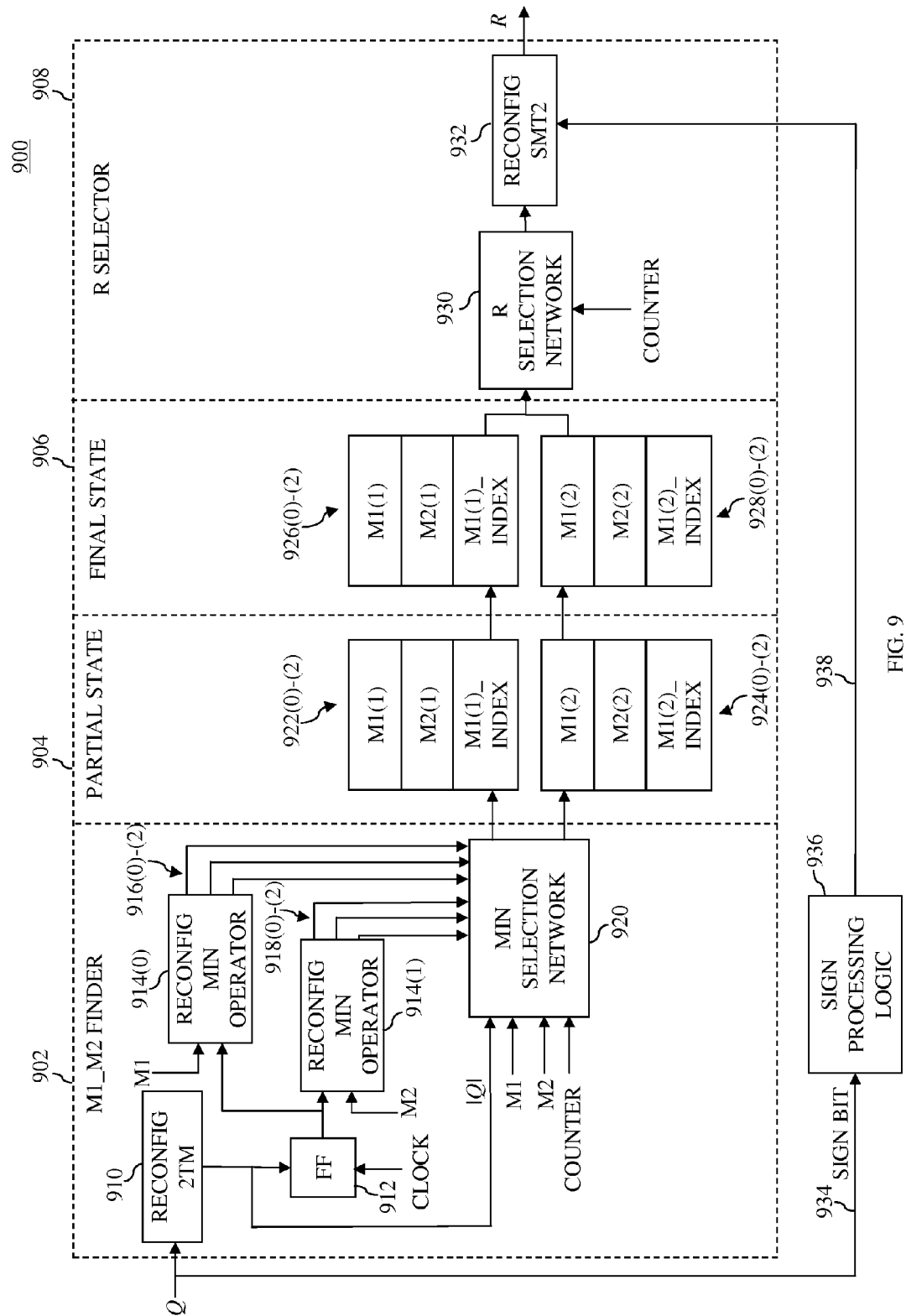
FIG. 9 shows a simplified block diagram of a reconfigurable CNU according to one embodiment of the present invention that may be used to implement each reconfigurable CNU of the reconfigurable CNU arrays of the LDPC decoder of FIG. 8.

FIG. 9 shows a simplified block diagram of a reconfigurable CNU 900 according to one embodiment of the present invention that may be used to implement each reconfigurable CNU of each reconfigurable CNU array 812 of FIG. 8. In five-bit precision mode, reconfigurable CNU 900 is configured as two five-bit CNUs, such that it performs updates for two check nodes (i.e., rows) of H-matrix 100 of FIG. 1 at the same time. Initially, reconfigurable CNU 900 receives 20 five-bit Q messages, ten corresponding to each check node, and generates 20 five-bit R messages, ten corresponding to each check node, per iteration. For the following discussion, it will be understood that any reference to Q messages, applies to soft values $L_n^{(0)}$ during the first iteration.

The 20 five-bit Q messages are received over ten clock cycles such that two five-bit Q messages, corresponding to two different check nodes (i.e., rows) of H-matrix 100 of FIG. 1, are received during each of the ten clock cycles. The 20 five-bit Q messages are provided to M1_M2 finder 902, and the sign bits 934 of all 20 five-bit Q messages are provided to sign processing logic 936. Sign processing logic 936 (i) generates a first product of the Q sign bits 934 of all ten Q messages corresponding to the first check node, (ii) generates a second product of the Q sign bits 934 of all ten Q messages corresponding to the second check node, (iii) multiplies each Q sign bit 934 corresponding to the first check node by the first product to generate a different sign bit (i.e., sign bit 938) for each of 10 R messages generated for the first check node, and (iv) multiplies each Q sign bit 934 corresponding to the second check node by the second product to generate a different sign bit (i.e., sign bit 938) for each of 10 R messages generated for the second check node.

M1_M2 finder 902 processes the 20 five-bit Q messages to determine (i) minimum (M1(1)) and second minimum (M2(1)) magnitudes for the ten five-bit Q messages corresponding to the first check node and (ii) minimum (M1(2)) and second minimum (M2(2)) magnitudes for the ten five-bit Q messages corresponding to the second check node. The minimum (M1(1)) and second minimum (M2(1)) magnitudes for the ten five-bit Q messages corresponding to the first check node are stored in partial state registers 922(0) and 922(1) of partial state memory 904, respectively, and the minimum (M1(2)) and second minimum (M2(2)) magnitudes for the ten five-bit Q messages corresponding to the second check node are stored in partial state registers 924(0) and 924(1), respectively.

During each of the first ten clock cycles, M1 M2 finder 902 receives two five-bit Q messages $Q_1$ and $Q_2$ in two's-complement format and generates four-bit first and second magnitude values $|Q_1|$ and $|Q_2|$ in sign-magnitude format using reconfigurable two's-complement-to-magnitude (2TM) converter 910, which is configured as two five-bit 2TM converters. An embodiment of a reconfigurable 2TM converter is discussed below in relation to FIG. 10. The first and second magnitude values $|Q_1|$ and $|Q_2|$ are provided to (i) minimum selection network 920 and (ii) flip-flop (FF) 912. Flip-flop 912, which synchronizes the timing of CNU 900 with the clock signal of reconfigurable LDPC decoder 800, provides the first and second magnitude values $|Q_1|$ and $|Q_2|$ to both reconfigurable minimum operators 914(0) and 914(1), each of which is configured as two five-bit minimum operators. An embodiment of a reconfigurable minimum operator is discussed below in relation to FIG. 12.

Reconfigurable minimum operator 914(0) compares (i) the first magnitude value $|Q_1|$ to minimum magnitude value M1(1) stored in M1(1) register 922(0) and (ii) the second magnitude value $|Q_2|$ to minimum magnitude value M1(2) stored in M1 (2) register 924(0). Initially, the minimum magnitude values M1(1) and M1(2) may be set to suitably large values. If the first magnitude value $|Q_1|$ is smaller than minimum magnitude value M1(1), then minimum operator 914(0) asserts control signal 916(0) (i.e., sets 916(0) equal to 1). Otherwise, minimum operator 914(0) de-asserts control signal 916(0) (i.e., sets 916(0) equal to 0). Similarly, if the second magnitude value $|Q_2|$ is smaller than minimum magnitude value M1(2) stored in M1(2) register 924(0), then minimum operator 914(0) asserts control signal 916(1). Otherwise, minimum operator 914(0) de-asserts control signal 916(1). Minimum operator 914(1) compares the first and second magnitude values $|Q_1|$ and $|Q_2|$ to second minimum magnitude values M2(1) and M2(2) stored in M2 registers 922(1) and 924(1), respectively, in a similar manner, and outputs control signals 918(0) and 918(1) to minimum selection network 920. Minimum selection network 920 selects values to store in registers 922 and 924 based on the signals received from reconfigurable minimum operators 914(0) and 914(1). To further understand the operation of minimum selection network 920 in five-bit precision mode, consider Table III.

TABLE III

Minimum Selection Network 920 Logic Table for Partial State Memory 922

| Control Signal 916(0) | Control Signal 918(0) | Output to 922(0) | Output to 922(1) |
|---|---|---|---|
| 0 ($|Q_1| \geq$ M1(1)) | 0 ($|Q_1| \geq$ M2(1)) | M1(1) | M2(1) |
| 0 ($|Q_1| \geq$ M1(1)) | 1 ($|Q_1| <$ M2(1)) | M1(1) | $|Q_1|$ |

TABLE III-continued

Minimum Selection Network 920 Logic Table for Partial State Memory 922

| Control Signal 916(0) | Control Signal 918(0) | Output to 922(0) | Output to 922(1) |
|---|---|---|---|
| 1 ($|Q_1| < M1(1)$) | 0 ($|Q_1| \geq M2(1)$) | N/A | N/A |
| 1 ($|Q_1| < M1(1)$) | 1 ($|Q_1| < M2(1)$) | $|Q_1|$ | M1(1) |

Table III shows a logic table for minimum selection network 920 for selecting the minimum M1(1) and second minimum M2(1) values corresponding to a first check node (i.e., row) to store in partial state registers 922(0) and 922(1), respectively. Note that a similar table may be generated based on control signals 916(0) and 918(0) to select minimum M1(2) and second minimum M2(2) values to store in partial state registers 924(0) and 924(1), respectively. As shown in Table III, if control signals 916(0) and 918(0) are both de-asserted (i.e., $|Q_1| \geq$ both M1(1) and M2(1)), then minimum magnitude value M1(1) and second minimum value M2(1) are stored in M1(1) register 922(0) and M2(1) register 922(1), respectively, and first magnitude value $|Q_1|$ is discarded. If control signal 916(0) is de-asserted and control signal 918(0) is asserted (i.e., M2(1)$\geq |Q_1|>$M1(1)), then (i) minimum magnitude value M1(1) is stored in M1(1) register 922(0), (ii) first magnitude value $|Q_1|$ is stored in M2(1) register 922(1), and (iii) previously stored second minimum magnitude value M2(1) is discarded. If control signals 916(0) and 918(0) are both asserted (i.e., $|Q_1| \leq$ M1(1) and M2(1)), then (i) magnitude value $|Q_1|$ is stored in M1(1) register 922(0), (ii) the previously stored minimum value M1(1) is stored in M2(1) register 922(1), and (iii) the previously stored second minimum value M2(1) is discarded. Whenever a new magnitude value $|Q_1|$ is stored in M1(1) register 922(0), M1_index register 922(2) is enabled, counter value GV corresponding to the new minimum value M1(1) is stored in M1_index register 922(2), and the counter value previously stored in M1_index register 922(2) is discarded. In addition, the counter value previously stored in M1(1)_index register 922(2) is replaced with a counter value corresponding to new minimum magnitude value M1(1). Note that it is not possible that control signal 916(0) will be asserted and control signal 918(0) will be de-asserted because this would indicate that first magnitude value $|Q_1|$ is smaller than minimum magnitude value M1(1) but larger than second minimum magnitude value M2(1).

After all 20 ten-bit Q messages have been considered (i.e., ten for each check node), the contents of registers 922(0), ..., 922(2) and 924(0), ..., 924(2) of partial state memory 904 are provided to registers 926(0), ..., 926(2) and 928(0), ..., 928(2) of final state memory 906, respectively. Moving the contents of partial state memory 904 to final state memory 906 allows M1_M2 finder 902 and partial state memory 904 to begin processing Q messages for a subsequent iteration. R selection network 930 of R selector 908 outputs two five-bit R messages, one for each check node (i.e., row), per clock cycle, where each R message is based on (1) a minimum magnitude value (i.e., M1(1) or M1(2)), (2) a second minimum magnitude value (i.e., M2(1) or M2(2)), (3) a comparison of the index value for the minimum magnitude (i.e., M1(1)_index or M1(2)_index) to the counter, and (4) a sign bit 938 from sign processing logic 936. Each sign bit 938 may be generated in a manner similar to that shown in Equation (3), or alternatively, in the event that sign processing logic 936 is implemented using a FIFO, by subtracting a sign bit 934 stored in sign processing logic 936 corresponding to either the first or second check node from the sum stored in sign processing logic 936 that corresponds to the same check node. To further understand how R messages are output from R selection network 930 consider Table IV.

TABLE IV

R Selection Network 930 Logic Table

| Comparison of M1(1)_Index to Counter | Sign Bit 938 | R Selection Network 930 Output |
|---|---|---|
| 0 (M1(1)_Index ≠ Counter) | 0 | $R_1 = +M1(1)$ |
| 0 (M1(1)_Index ≠ Counter) | 1 | $R_1 = -M1(1)$ |
| 1 (M1(1)_Index = Counter) | 0 | $R_1 = +M2(1)$ |
| 1 (M1(1)_Index = Counter) | 1 | $R_1 = -M2(1)$ |

Table IV shows a logic table for selecting five-bit R messages corresponding to the first check node (i.e., row) considered by reconfigurable CNU 900. Note that a similar logic table may be generated for selecting five-bit R messages corresponding to the second check node considered by reconfigurable CNU 900. As shown, if both (i) M1(1)_index is not equal to the counter value and (ii) sign bit 938 is de-asserted, then the positive M1(1) value will be output as the five-bit $R_1$ message. If (i) M1(1)_index is not equal to the counter value and (ii) sign bit 938 is asserted, then the negative M1(1) value will be output as the five-bit $R_1$ message. If (i) M1(1)_index is equal to the counter value and (ii) sign bit 938 is de-asserted, then the positive M2(1) value will be output as the five-bit $R_1$ message. If (i) M1(1)_index is equal to the counter value and (ii) sign bit 938 is asserted, then the negative M2(1) value will be output as the five-bit $R_1$ message. After the five-bit R messages are output from R selection network 930, the R messages may be offset by a value β as shown in Equation (1) and converted from sign-magnitude format to two's-complement format using reconfigurable SMT2 converter 932.

In ten-bit precision mode, reconfigurable CNU 900 also performs updates for two check nodes (i.e., rows) of H-matrix 100 of FIG. 1. However, rather than performing two updates at a time, as is done in five-bit precision mode, the updates are performed one at a time in alternating (i.e., ping-pong) fashion, wherein an update for the first check node is performed, followed by an update for the second check node, followed by an update for the first check node, and so on.

Initially, reconfigurable CNU 900 receives 20 five-bit Q messages, ten corresponding to each check node, and generates 20 five-bit R messages, ten corresponding to each check node, per iteration. The Q messages are received, one message per clock cycle, in alternating fashion such that a message for the first check node is received, followed by a message for the second check node, followed by a message for the first check node, and so on. The 20 ten-bit Q messages are provided to M1_M2 finder 902, and the sign bits 934 of the 20 ten-bit Q messages are provided to sign processing logic 936. Sign processing logic 936 (i) generates a first product of the sign bits 934 of all ten Q messages corresponding to the first check node, (ii) generates a second product of the sign bits 934 of all ten Q messages corresponding to the second check node, (iii) multiplies each Q sign bit 934 corresponding to the first check node by the first product to generate a different sign bit (i.e., sign bit 938) for each of 10 R messages generated for the first check node, and (iv) multiplies each Q sign bit 934 corresponding to the second check node by the second product to generate a different sign bit (i.e., sign bit 938) for each of 10 R messages generated for the second check node.

M1_M2 finder 902 processes the 20 ten-bit Q messages in alternating fashion to determine (i) minimum (M1(1)) and second minimum (M2(1)) magnitudes for the ten ten-bit Q messages corresponding to the first check node and (ii) minimum (M1(2)) and second minimum (M2(2)) magnitudes for the ten ten-bit Q messages corresponding to the second check node. The minimum (M1(1)) and second minimum (M2(1)) magnitudes for the ten Q messages corresponding to the first check node are stored in partial state registers 922(0) and 922(1) of partial state memory 904, respectively, and the minimum (M1(2)) and second minimum (M2(2)) magnitudes for the ten Q messages corresponding to the second check node are stored in partial state registers 924(0) and 924(1), respectively.

During each of the first 20 clock cycles, M1_M2 finder 902 receives one ten-bit Q message (e.g., $Q_1$ or $Q_2$) corresponding to either the first or second check node in two's-complement format and generates a magnitude value (e.g., $|Q_1|$ or $|Q_2|$) using reconfigurable 2TM converter 910, which is configured as a ten-bit 2TM converter. The ten-bit magnitude value (e.g., $|Q_1|$ or $|Q_2|$) is provided to (i) minimum selection network 920 and (ii) flip-flop (FF) 912. Flip-flop 912 provides the ten-bit magnitude value (e.g., $|Q_1|$ or $|Q_2|$) to both reconfigurable minimum operators 914(0) and 914(1), each of which is configured as one ten-bit minimum operator.

Reconfigurable minimum operator 914(0) compares magnitude values $|Q_1|$ corresponding to the first check node to minimum magnitude value M1(1) stored in register 922(0) and magnitude values $|Q_2|$ corresponding to the second check node to a minimum magnitude value M1(2) stored in register 924(0). If a magnitude value $|Q_1|$ corresponding to the first check node is smaller than minimum magnitude value M1(1) or if a magnitude value $|Q_2|$ corresponding to the second check node is smaller than minimum magnitude value M1(2), then minimum operator 914(0) asserts control signal 916(2) (i.e., sets 916(2) equal to 1). Otherwise, minimum operator 914(0) de-asserts control signal 916(2) (i.e., sets 916(2) equal to 0). In a similar manner, minimum operator 914(1) compares magnitude values $|Q_1|$ and $|Q_2|$ corresponding to the first and second check nodes to second minimum magnitude values M2(1) and M2(2) stored in M2 registers 922(1) and 924(1), respectively, and outputs control signal 918(2) based on the comparison to minimum selection network 920.

Minimum selection network 920 selects magnitude values (M1(1), M1(2), M2(1), M2(2)) and index values (M1(1)_index, M1(2)_index) to store in partial state registers 922 and 924. Selection may be made in a manner similar to that performed by minimum selection network 920 when operating in the five-bit precision mode. In so doing, selection may be made using a logic table similar to that of Table III. However, unlike the five-bit precision mode, in ten-bit precision mode, values are provided to only one bank of registers (i.e., 922 or 924) per clock cycle.

After all 20 Q messages have been considered (i.e., ten for each check node), the contents of registers 922(0), . . . , 922(2) and 924(0), . . . , 924(2) of partial state memory 904 are provided to registers 926(0), . . . , 926(2) and 928(0), . . . , 928(2) of final state memory 906, respectively. R selection network 930 of R selector 908 outputs one ten-bit R message per clock cycle. The ten-bit R messages are output in alternating fashion such that an R message for the first check node is output, followed by an R message for the second check node, followed by an R message for the first check node, and so on. Each ten-bit R message, which may be generated in a manner similar to that of the five-bit precision mode, is based on (1) a minimum magnitude value (i.e., M1(1) or M1(2)), (2) a second minimum magnitude value (i.e., M2(1) or M2(2)), (3) a comparison of the index value for the minimum magnitude (i.e., M1(1)_index or M1(2)_index) to the counter, and (4) a sign bit 938 from sign processing logic 936. In so doing, each ten-bit R message may be generated and output based on a logic table similar to Table IV.

After the ten-bit R messages are output from R selection network 930, a sign bit 938 from sign processing logic 936 is added to each ten-bit R message such that each ten-bit R message is represented in sign-magnitude format, and the resulting sign-magnitude R messages are converted to two's-complement format using reconfigurable sign-magnitude-to-two's-complement (SMT2) converter 932. Note that the ten-bit R messages may be offset by a value β as shown in Equation (1) either before or after conversion to two's-complement format. An embodiment of a reconfigurable minimum operator is discussed below in relation to FIG. 17.

Figure 10:
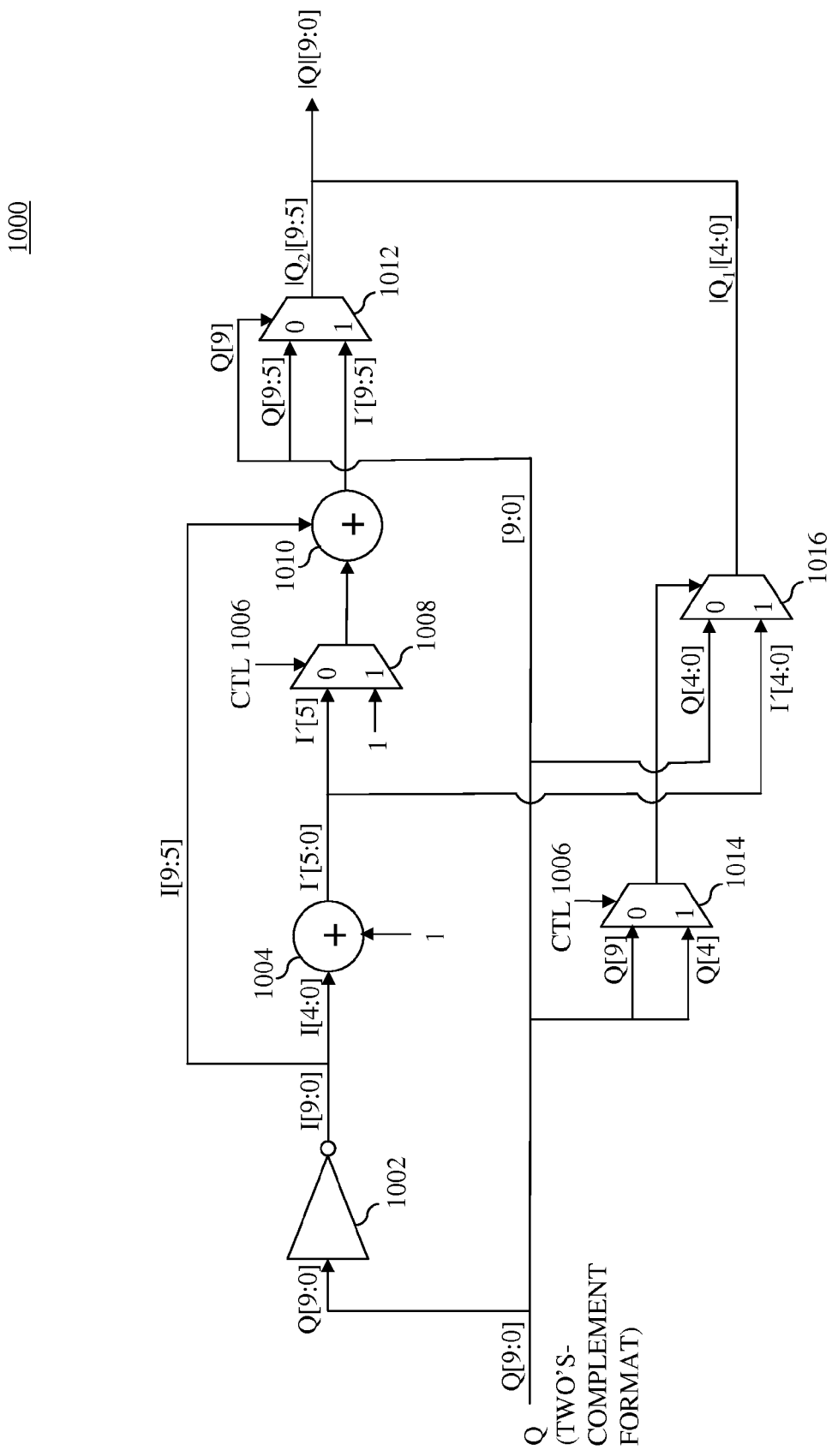
FIG. 10 shows a simplified block diagram of a reconfigurable two's-complement-to-magnitude (2TM) converter according to one embodiment of the present invention that may be used to implement the reconfigurable 2TM converter of the reconfigurable CNU of FIG. 9.

FIG. 10 shows a simplified block diagram of a reconfigurable 2TM converter 1000 according to one embodiment of the present invention that may be used to implement reconfigurable 2TM converter 910 of FIG. 9. In the five-bit precision mode, reconfigurable 2TM converter 1000 receives ten bits Q[9:0], comprising a first five-bit Q message Q[4:0] in serial with a second five-bit Q message Q[9:5]. In this mode, reconfigurable 2TM converter 1000 acts as two 2TM converters that convert two five-bit Q messages from two's-complement format into magnitude values in sign-magnitude format, where the sign bits are always equal to zero. The first 2TM converter comprises inverter 1002, adder 1004, and multiplexer 1016, and the second 2TM converter comprises inverter 1002, adder 1010, and multiplexer 1012. Multiplexers 1008 and 1014 are used to switch between the five-bit precision mode and the ten-bit precision mode as discussed below.

Inverter 1002 inverts both five-bit messages Q[9:5] and Q[4:0], and provides (i) the first inverted five-bit message I[4:0] to adder 1004 and (ii) the second inverted five-bit message I[9:5] to adder 1010. Adder 1004 adds a value of 1 to the first inverted five-bit message I[4:0] to generate a six-bit value I'[5:0]. The resulting sixth bit I'[5] is provided to the upper input of multiplexer 1008, and the remaining five bits I'[4:0] are provided to the lower input of multiplexer 1016. Multiplexer 1016, which receives the first input Q message Q[4:0] via its upper input, selects either the first inverted five-bit message I'[4:0] or the first input Q message Q[4:0] to output as the five-bit first magnitude $|Q_1|$, based on a control signal received from multiplexer 1014. Multiplexer 1014, which receives (i) the sign bit Q[4] of the first input Q message via its lower input, (ii) the sign bit Q[9] of the second input Q message via its upper input, and (iii) a control signal 1006, which is set to 1 (e.g., by controller 818 of FIG. 8) for five-bit precision mode, selects the sign bit Q[4] of the first input Q message as the control signal for multiplexer 1016. If the sign bit Q[4] of the first input Q message has a value of 0, then the first input Q message is output as the first magnitude |Q|, and if the sign bit Q[4] of the first input Q message has a value of 1, then the output of adder 1004 is output as the first magnitude $|Q_1|$.

Adder 1010 adds a value received from multiplexer 1008 to the second inverted five-bit message I[9:5]. Multiplexer 1008, which receives (i) a value of 1 via its lower input, (ii) the sixth bit I'[5] from adder 1004 via its upper input, and (iii) control signal 1006, which is set to 1 for five-bit precision mode, selects the value of 1 to output to adder 1010. Adder 1010 adds the value of 1 to the second inverted five-bit message I[9:5] and outputs the result I'[9:5] to the lower input of multiplexer 1012. Multiplexer 1012, which receives the second input Q message Q[9:5] via its upper input, selects either the first inverted five-bit message I[9:5] or the first input Q message Q[9:5] to output as the second magnitude $|Q_2|$, based on the sign bit Q[9] of the second input Q message. If the sign bit Q[9] has a value of 0, then the second input Q message Q[9:5] is output as the second magnitude value $|Q_2|$, and if the sign bit has a value of 1, then the output I'[9:5] of adder 1010 is output as the second magnitude value $|Q_2|$. The two five-bit magnitude values $|Q_1|$ and $|Q_2|$ are output in serial.

In the ten-bit precision mode, reconfigurable 2TM converter 1000 receives one ten-bit Q message Q[9:0]. The ten-bit Q message is divided into two sets of five bits Q[9:5] and Q[4:0], and each set is processed separately before being output in serial as one magnitude value $|Q|$. Inverter 1002, adder 1004, and multiplexer 1016 process the first set of five bits in a manner similar to that of the first five-bit Q message described above in relation to the five-bit precision mode. However, in ten-bit precision mode, control signal 1006 is set to 0. As a result, multiplexer 1014 selects the sign bit Q[9] of the ten-bit input Q message to output to multiplexer 1016, and multiplexer 1016 selects either its upper input or its lower input based on the sign bit Q[9] of the ten-bit input Q message. If the sign bit Q[9] has a value of 0, then the first set of five input bits Q[4:0] is output as the first half of the ten-bit magnitude value $|Q|$, and if the sign bit (Q[9]) has a value of 1, then the output 1[4:0] of adder 1004 is output as the first half of the ten-bit magnitude value $|Q_1|$.

Inverter 1002, adder 1010, and multiplexer 1012 process the second set of five bits Q[9:5] in a manner similar to that of the second five-bit Q message described above in relation to the five-bit precision mode. However, since control signal 1006 is set to 0, multiplexer 1008 selects the sixth bit I[5] from adder 1004 to output to adder 1010. The sixth bit is a carry-over bit that indicates whether, after adding the value of 1 to the first set of five bits I[4:0], a value of 1 should to be carried over to the second set of five-bits I[9:5]. For example, suppose that the first set of five bits I[4:0] output from inverter 1002 is 01010 and the second set of five bits I[9:5] output from inverter 1002 is 11111. After adding a 1 to the first set of five bits I[4:0], adder 1004 outputs a six-bit value I'[5:0] equal to 100000. The sixth bit I'[5] is then carried over such that it is added to the second set of five bits I[9:5] (01010) to obtain a value I'[9:5] of 01011. After the output of multiplexer 1008 is added to the second set of five bits I[9:5], the result I'[9:5] is provided to multiplexer 1012, which selects an output value $|Q_2|$ based on the tenth bit Q[9] in a manner similar to that described above in relation to the five-bit precision mode. The two sets of five bits are output in serial as one ten-bit magnitude value $|Q|$ such that the first value $|Q_1|$ is output before the second value $|Q_2|$.

Figure 11:
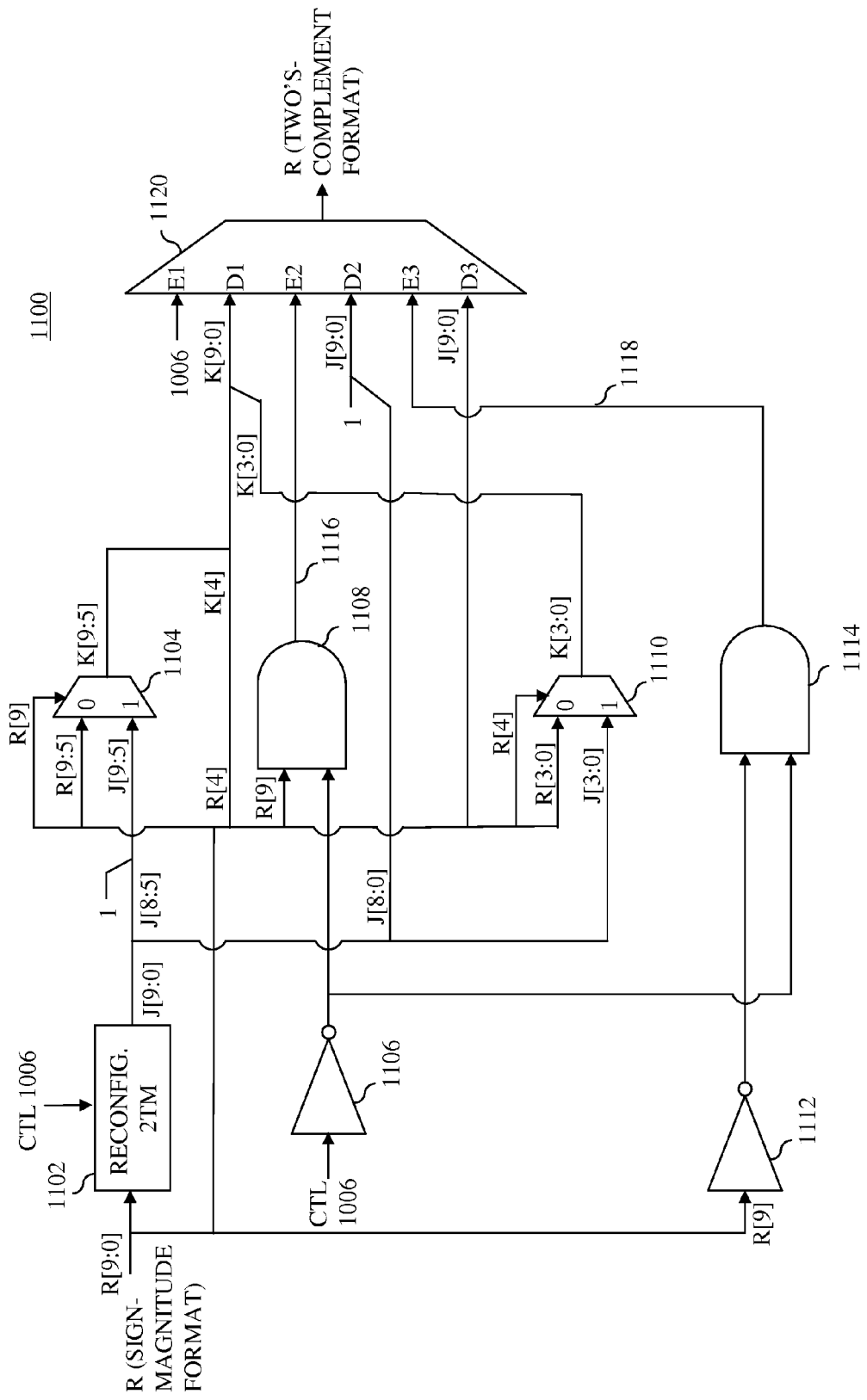
FIG. 11 shows a simplified block diagram of a reconfigurable sign-magnitude-to-two's-complement (SMT2) converter according to one embodiment of the present invention that may be used to implement the reconfigurable SMT2 converter of the reconfigurable CNU of FIG. 9.

FIG. 11 shows a simplified block diagram of a reconfigurable SMT2 converter 1100 according to one embodiment of the present invention that may be used to implement reconfigurable SMT2 converter 932 of FIG. 9. Reconfigurable SMT2 converter 1100 converts R messages from sign-magnitude format to two's-complement format. In so doing, reconfigurable SMT2 converter 1100 employs reconfigurable 2TM converter 1102 which may be implemented using reconfigurable 2TM converter 1000 of FIG. 10. Reconfigurable 2TM converter 1000, which in addition to converting two's-complement values into magnitude values in sign-magnitude format as described above, may also be used to convert sign-magnitude values into magnitude values in two's-complement format.

In the five-bit precision mode, reconfigurable SMT2 converter 1100 receives ten bits R[9:0], comprising a first five-bit R message R[4:0] in serial with a second five-bit R message R[9:5]. Reconfigurable SMT2 converter 1100 acts as two SMT2 converters to convert two five-bit R messages at the same time. The first five-bit R message R[4:0] is provided to multiplexer 1110 such that the most significant bit (MSB) R[4] is provided to the control port and the remaining four bits R[3:0] are provided to the upper input. Multiplexer 1110 also receives via its lower input a four-bit value J[3:0] that is obtained by (i) converting the first five-bit R message R[4:0] from sign-magnitude format into a five-bit magnitude value J[4:0] in two's-complement format using reconfigurable 2TM 1102 and (ii) dropping the MSB J[4] of the five-bit magnitude value J[4:0]. If the MSB R[4] of the first five-bit R message has a value of 1, then the lower input of multiplexer 1110 is output as the first two's-complement R message K[3:0] to first data port D1 of multiplexer 1120. Otherwise, the upper input of multiplexer 1110 is output as the first two's-complement R message K[3:0] to first data port D1.

The second five-bit R message R[9:5] is provided to multiplexer 1104 such that the MSB R[9] is provided to the control port and all five bits R[9:5] are provided to the upper input. Multiplexer 1104 also receives via its lower input a five-bit value J[9:5] that is obtained by (i) converting the second five-bit R message (R[9:5]) from sign-magnitude format into a five-bit magnitude value J[9:5] in two's-complement format using reconfigurable 2TM 1102 and (ii) replacing the MSB J[9] of the five-bit magnitude value J[9:5] with a value of 1. If the MSB of the second five-bit R message R[9] has a value of 1, then the lower input of multiplexer 1104 is output as the second two's-complement R message K[9:5] to first data port D1 of multiplexer 1120. Otherwise, the upper input of multiplexer 1104 is output as the second two's-complement R message K[9:5] to first data port D1. First data port D1 of multiplexer 1120 receives the (i) the output of multiplexer 1110, (ii) the MSB R[4] of the first R message, which serves as the sign bit for the first two's-complement R message, and (iii) the output of multiplexer 1104. Control signal 1006, which is provided to the first enable port E1 of multiplexer 1120, has a value of 1 in five-bit precision mode, and thus, the input of first data port D1 is output from multiplexer 1120.

In ten-bit precision mode, reconfigurable SMT2 converter 1100 receives ten bits R[9:0], comprising a one ten-bit R message R[9:0]. The ten-bit R message R[9:0] is provided to both (i) the third data port D3 of multiplexer 1120 and (ii) reconfigurable 2TM converter 1102. Reconfigurable 2TM converter 1102 converts the ten-bit R message R[9:0] into a ten-bit magnitude value J[9:0] in two's-complement format. The MSB J[9] of the ten-bit magnitude value J[9:0] is replaced by a value of 1, and the resulting ten-bit two's-complement value J[9:0] is provided to the second data port D2 of multiplexer 1120.

Multiplexer 1120 selects either the second data port D2 or third data port D3 to output based on control signals 1116 and 1118 received at second enable port E2 and third enable port E3, respectively. Control signal 1116 is generated by (i) inverting control signal 1006, which is set to 0 in ten-bit precision mode, using inverter 1106 and (ii) applying the inverse of control signal 1006 to AND gate 1108 along with the MSB R[9] of the received ten-bit R message R[9:0]. Control signal 1118 is generated by (i) inverting the MSB R[9] of the received ten-bit R message R[9:0] using inverter 1112, and (ii) applying the inverted MSB R[9] to AND gate 1114 along with inverted control signal 1006 received from inverter 1106. If control signal 1116 has a value of 1, then second enable port E2 is enabled, and second data port D2 is output as the ten-bit two's-complement R message. If control signal 1118 is has a value of 1, then third enable port E3 is enabled, and third data port D3 is output as the ten-bit two's-complement R message. Note that second and third enable ports E2 and E3 will not be enabled at the same time.

Figure 12:
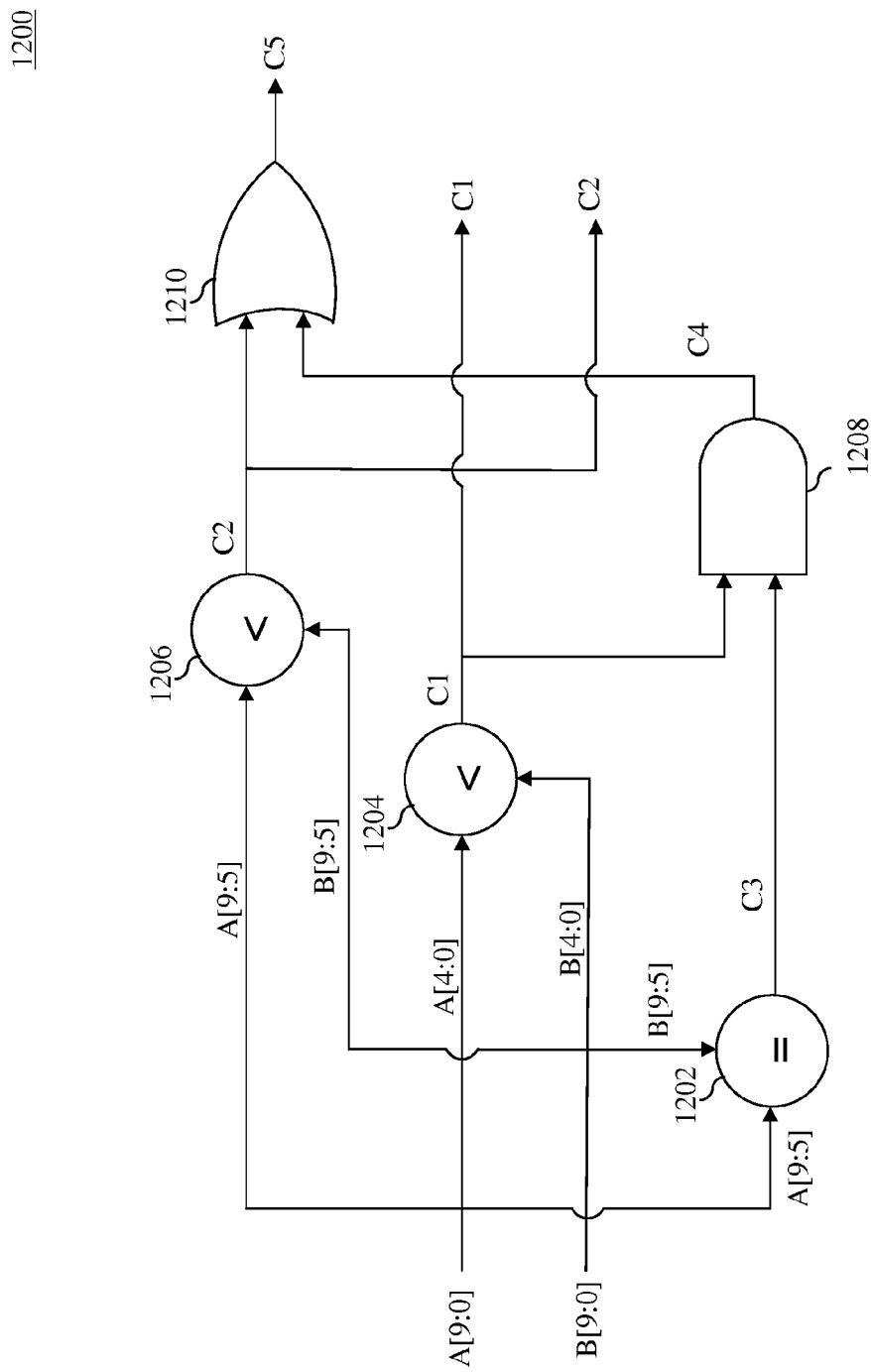
FIG. 12 shows a simplified block diagram of a reconfigurable minimum operator 1200 according to one embodiment of the present invention that may be used to implement the reconfigurable minimum operators of the reconfigurable CNU of FIG. 9.

FIG. 12 shows a simplified block diagram of a reconfigurable minimum operator 1200 according to one embodiment of the present invention that may be used to implement reconfigurable minimum operators 914(0) and 914(1) of FIG. 9. In the five-bit precision mode, reconfigurable minimum operator 1200, which is configured as two five-bit minimum operators (i.e., minimum operators 1204 and 1206), receives (i) a first set of ten bits A[9:0], comprising a first five-bit message A[4:0] in serial with a second five-bit message A[9:5], and (ii) a second set of ten bits B[9:0], comprising a third five-bit message B[4:0] in serial with a fourth five-bit message B[9:5]. The first through fourth five-bit messages may be, for example, a first input Q message, a second input Q message, a minimum value M1(1) stored in M1(1) register 922(0), and a minimum value M1(2) stored in M1(2) register 924(0), respectively.

Minimum operator 1204 compares the first five-bit message A[4:0] to the third five-bit message B[4:0] and outputs a value C1 based on the comparison. If the first five-bit message A[4:0] is less than the third five-bit message B[4:0], then minimum operator 1204 outputs a value of C1 equal to 1. Otherwise, minimum operator 1204 outputs a value of C1 equal to 0. Similarly, minimum operator 1206 compares the second five-bit message A[9:5] to the fourth five-bit message B[9:5] and outputs a value C2 based on the comparison. If the second five-bit message A[9:5] is less than the fourth five-bit message B[9:5], then minimum operator 1206 outputs a value of C2 equal to 1. Otherwise, minimum operator 1206 outputs a value of C2 equal to 0. AND gate 1208, comparer 1202, and OR gate 1210 are not used in the five-bit precision mode.

Based on the value of C1, minimum selection network 920 of FIG. 9 may determine whether to replace, for example, minimum value M1(1) stored in M1(1) register 922(0) with the first input Q message A[4:0]. Similarly, based on the value of C2, minimum selection network 920 may determine whether to replace, for example, minimum value M1(2) stored in M1(2) register 924(0) with the second input Q message A[9:5].

In the ten-bit precision mode, reconfigurable minimum operator 1200, configured as one ten-bit minimum operator, receives (i) a first ten-bit message A[9:0], which may be an input Q message, and (ii) a second ten-bit message B[9:0], which may be a minimum value stored in M1(1) register 922(0). The first ten-bit message is divided into a first set of the five least significant bits (LSBs) A[4:0] and a second set of the five MSBs A[9:5]. Similarly, the second ten-bit message is divided into a first set of the five LSBs B[4:0] and a second set of the five MSBs B[9:5]. Minimum operator 1200 determines whether the first ten-bit message is less than the second ten-bit message by comparing (i) the five LSBs of the first and second ten-bit messages A[4:0] and B[4:0] to one another and (ii) the five MSBs of the first and second ten-bit messages A[9:5] and B[9:5] to one another.

Minimum operator 1204 determines whether the set of the five LSBs A[4:0] for the first ten-bit message is less than the set of the five LSBs B[4:0] for the second ten-bit message. If the set of five LSBs A[4:0] of the first ten-bit message is less than the set of five LSBs B[4:0] of the second ten-bit message, then minimum operator 1204 outputs a value C1 equal to 1. Otherwise, minimum operator 1204 outputs a value C1 equal to 0. Similarly, minimum operator 1206 compares the sets of five MSBs A[9:5] and B[9:5] for the first and second ten-bit messages, respectively. If the set of five MSBs A[9:5] of the first ten-bit message is less than the set of five MSBs A[9:5] of the second ten-bit message, then minimum operator 1206 outputs a value C2 equal to 1. Otherwise, minimum operator 1206 outputs a value C2 equal to 0. Comparer 1202 compares the set of five MSBs A[9:5] of the first ten-bit message to the set of five MSBs B[9:5] of the second ten-bit message to determine if they are equal. If they are not equal, then comparer 1202 outputs a value C3 equal to 0. Otherwise, comparer 1202 outputs a value C3 equal to 1.

To understand the operation of AND gate 1208, consider the logic table shown in Table V. As shown in rows one and two, when the sets of five MSBs A[9:5] and B[9:5] of the first and second ten-bit messages, respectively, are not equal (C3=0), AND gate 1208 outputs a value C4 equal to 0. As shown in row three, when the sets of five MSBs A[9:5] and B[9:5] of the first and second ten-bit messages, respectively, are equal (i.e., C3=1), and the set of five LSBs A[4:0] of the first ten-bit message is greater than or equal to the set of five LSBs B[4:0] of the second ten-bit message (i.e., C1=0), AND gate 1208 also outputs a value C4 of 0 as shown. In this case, the first ten-bit message A[9:0] is greater than or equal to the second ten-bit message B[9:0]. As shown in row four, when the sets of five MSBs A[9:5] and B[9:5] of the first and second ten-bit messages, respectively, are equal (i.e., C3=1) and the set of five LSBs A[4:0] of the first ten-bit message is less than or the set of five LSBs B[4:0] of the second ten-bit message (i.e., C1=1), AND gate 1208 outputs a value C4 equal to 1. In this case, the first ten-bit message A[9:0] is less than the second ten-bit message B[9:0].

TABLE V

AND Gate 1208 Logic Table

| Input C3 | Input C1 | Output C4 |
|---|---|---|
| 0 (A[9:5] ≠ B[9:5]) | 0 (A[4:0] ≧ B[4:0]) | 0 |
| 0 (A[9:5] ≠ B[9:5]) | 1 (A[4:0] < B[4:0]) | 0 |
| 1 (A[9:5] = B[9:5]) | 0 (A[4:0] ≧ B[4:0]) | 0 (A[9:0] ≧ B[9:0]) |
| 1 (A[9:5] = B[9:5]) | 1 (A[4:0] < B[4:0]) | 1 (A[9:0] < B[9:0]) |

To understand the operation of OR gate 1210, consider the logic table shown in Table VI. As shown in row one, when the set of five MSBs A[9:5] of the first ten-bit message is greater than or equal to the set of five MSBs B[9:5] of the second ten-bit message (C2=0), and value C4 is equal to 0, OR gate 1210 outputs a value C5 of 0 indicating that the first ten-bit message A[9:0] is greater than the second ten-bit message B[9:0]. As shown in row two, when the set of five MSBs A[9:5] of the first ten-bit message is greater than or equal to the set of five MSBs B[9:5] of the second ten-bit message (C2=0), and value C4 is equal to 1, OR gate 1210 outputs a value C5 of 1, indicating that the first ten-bit message A[9:0] is less than the second ten-bit message B[9:0]. As shown in rows three and four, when the set of five MSBs A[9:5] of the first ten-bit message is less than the set of five MSBs B[9:5] of the second ten-bit message (C2=1), OR gate 1210 outputs a value C5 of 1 indicating that the first ten-bit message A[9:0] is less than the second ten-bit message B[9:0]. Based on the value of C5, minimum selection network 920 of FIG. 9 determines whether to replace, for example, the minimum value stored in M1(1) register 922(0) with the received ten-bit Q message A[9:0].

TABLE VI

OR Gate 1210 Logic Table

| Input C2 | Input C4 | Output C5 |
|---|---|---|
| 0 (A[9:5] ≧ B[9:5]) | 0 | 0 (A[9:0] > B[9:0]) |
| 0 (A[9:5] ≧ B[9:5]) | 1 | 1 (A[9:0] < B[9:0]) |

TABLE VI-continued

OR Gate 1210 Logic Table

| Input C2 | Input C4 | Output C5 |
|---|---|---|
| 1 (A[9:5] < B[9:5]) | 0 | 1 (A[9:0] < B[9:0]) |
| 1 (A[9:5] < B[9:5]) | 1 | 1 (A[9:0] < B[9:0]) |

Reconfigurable Variable-Node Unit

Each reconfigurable VNU of reconfigurable VNU array 804 may be configured in a manner similar to that of VNU 600 of FIG. 6. However, rather than using five-bit adders, such as adders 602(0), 602(1), 604, 610, and 614(0), ..., 614(3), each of these adders may be replaced with a reconfigurable adder such as reconfigurable adder 1300 of FIG. 13.

Figure 13:
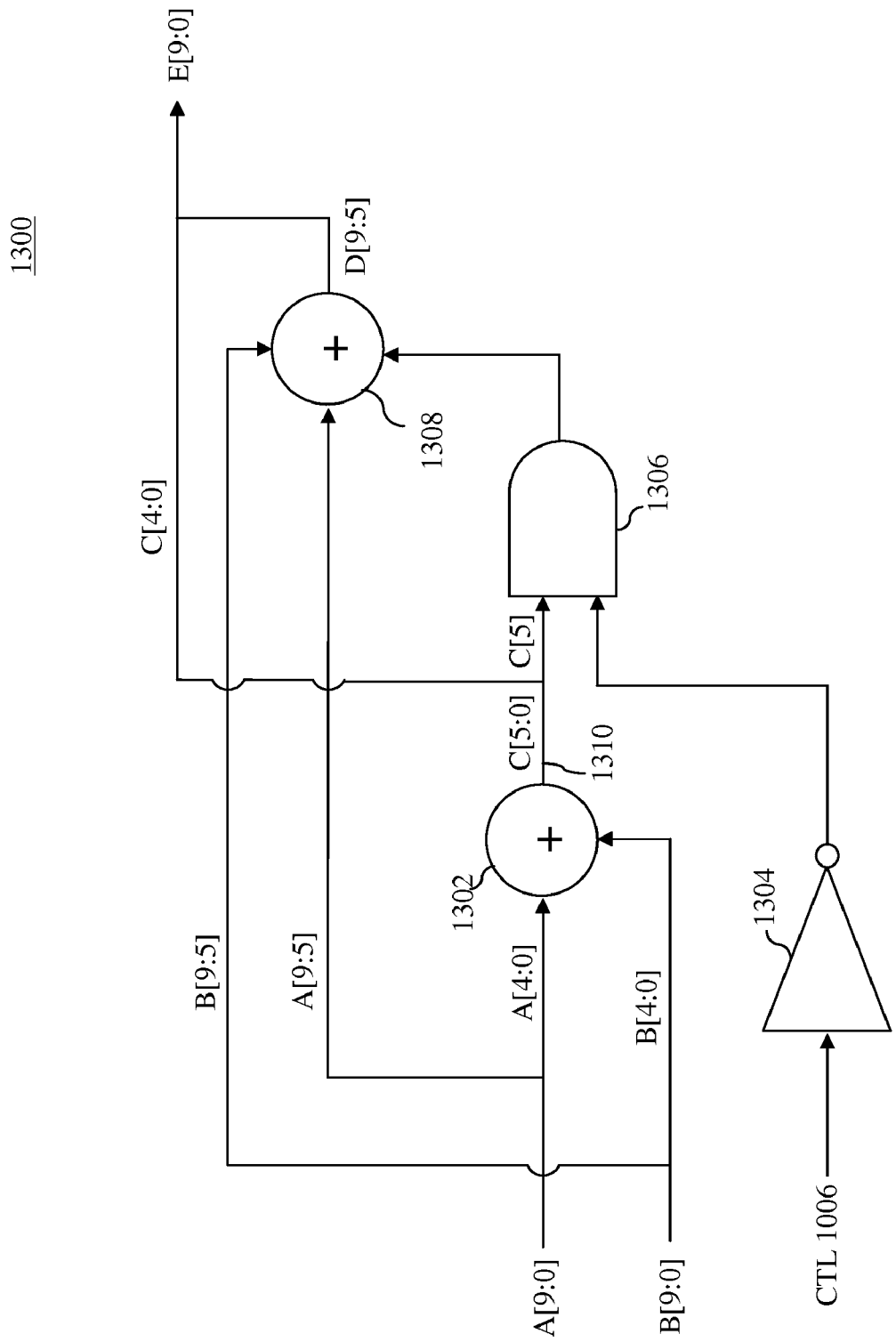
FIG. 13 shows a simplified block diagram of a reconfigurable adder according to one embodiment of the present invention.

FIG. 13 shows a simplified block diagram of a reconfigurable adder 1300 according to one embodiment of the present invention. In the five-bit precision mode, reconfigurable adder 1300 is configured as two five-bit adders, where adder 1302 is a first adder, and adder 1308 is a second adder. Reconfigurable adder 1304 receives (i) a first set of ten bits A[9:0], comprising a first five-bit message A[4:0] in serial with a second five-bit message A[9:5], and (ii) a second set of ten bits B[9:0], comprising a third five-bit message B[4:0] in serial with a fourth five-bit message B[9:5]. Adder 1302 adds the first five-bit message A[4:0] to the third five-bit message B[4:0] and outputs a first sum 1310 C[5:0] having six bits. The five LSBs of first sum 1310 are provided to the output of reconfigurable adder 1300 as C[4:0] and (ii) the MSB C[5] of first sum 1310 is provided to the upper input of AND gate 1306.

Inverter 1304 receives control signal 1006, which is set equal to 1 in five-bit precision mode, and outputs an inverted control signal 1006 (i.e., 0) to the lower input of AND gate 1306. Table VII shows a logic table for the operations of AND gate 1306. As shown, when reconfigurable adder 1300 is in five-bit precision mode (i.e., inverted control signal 1006=0), AND gate 1306 outputs a value of 0 to adder 1308. Adder 1308 sums (i) the second five-bit message A[9:5], (ii) the fourth five-bit message B[9:5], and (iii) the output of AND gate 1306, and provides a second sum D[9:5] to the output of reconfigurable adder 1300. Note that adding these values together may result in a value that has more than five bits. To produce five-bit outputs, the first sum C[4:0] and the second sum D[9:5] may be saturated (not shown). The first sum C[4:0] and the second sum D[9:5] are output in serial as E[9:0] such that the first sum C[4:0] is output before the second sum D[9:5].

TABLE VII

AND Gate 1306 Logic Table

| Inverted Control Signal 1006 | MSB for Sum 1310 | Output |
|---|---|---|
| 0 | 0 | 0 |
| 0 | 1 | 0 |
| 1 | 0 | 0 |
| 1 | 1 | 1 |

In the ten-bit precision mode, reconfigurable adder 1300, configured as one ten-bit adder, receives (i) a first ten-bit message A[9:0] and (ii) a second ten-bit message B[9:0]. The first ten-bit message is divided into a set of the five LSBs A[4:0] and a set of the five MSBs A[9:5]. Similarly, the second ten-bit message is divided into a set of the five LSBs B[4:0] and a set of the five MSBs B[9:5]. Adder 1302 sums the two sets of five LSBs A[4:0] and B[4:0], and outputs a first sum 1310 C[5:0] having six bits. The five LSBs of first sum 1310 are provided to the output of reconfigurable adder 1300 as C[4:0], and the MSB C[5] of first sum 1310 is provided to the upper input of AND gate 1306. The MSB of first sum 1310 indicates whether a bit should be carried over from the sum of the LSBs to the sum of the MSBs.

Inverter 1304 receives control signal 1006, which is set to 0 in ten-bit mode, and outputs inverted control signal 1006 (i.e., 1) to the lower input of AND gate 1306. As shown in Table VI, when inverted control signal 1006 is 1, and the MSB of first sum 1310 (i.e., the carry-over bit) is equal to 0, then a value of 0 is provided to adder 1308. When inverted control signal 1006 is 1, and the MSB of first sum 1310 is equal to 1, then a value of 1 is provided to adder 1308. Adder 1308 sums (i) the set of five MSBs A[9:5] corresponding to the first ten-bit message, (ii) the set of five MSBs B[9:5] corresponding to the second ten-bit message, and (iii) the output of AND gate 1306, and provides a second sum D[9:5] to the output of reconfigurable adder 1300, such that the first sum C[4:0] and the second sum D[9:5] form a single ten-bit sum E[9:0].

Reconfigurable Cyclic Shifter

Figure 14:
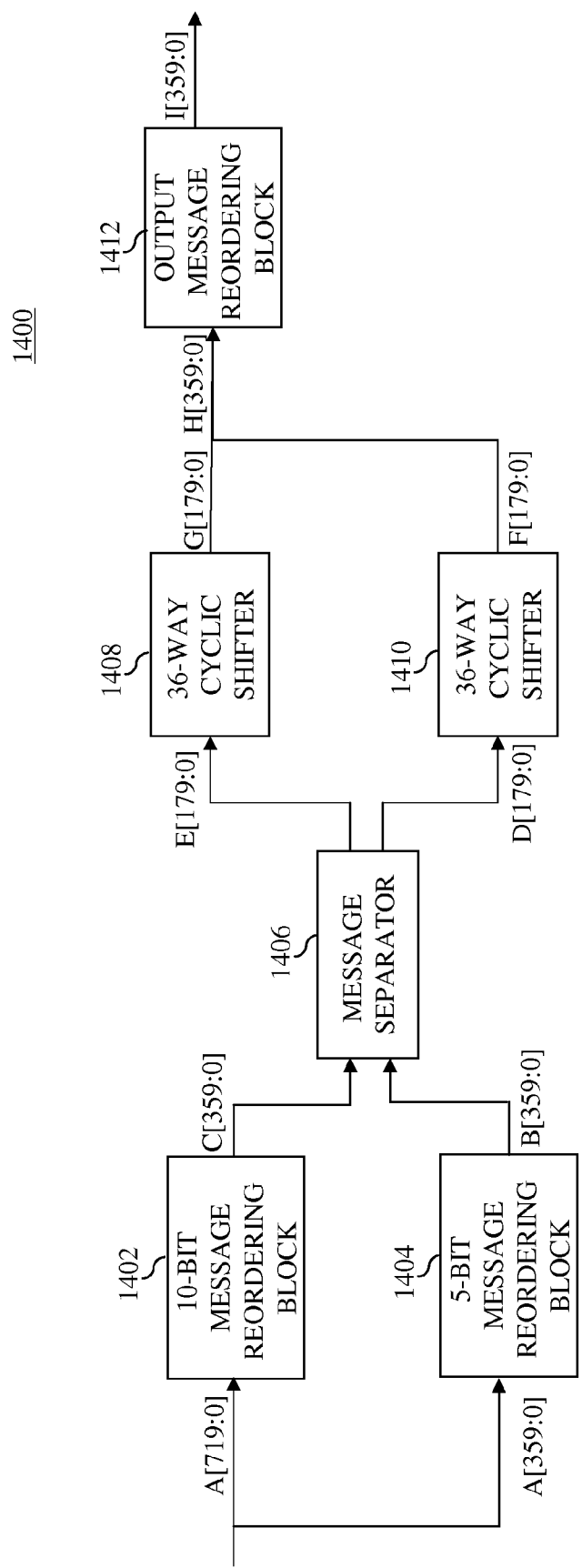
FIG. 14 shows a simplified block diagram of a reconfigurable cyclic shifter according to one embodiment of the present invention that may be used to implement each reconfigurable cyclic shifter of the LDPC decoder of FIG. 8.

FIG. 14 shows a simplified block diagram of a reconfigurable cyclic shifter 1400 according to one embodiment of the present invention that may be used to implement each of reconfigurable cyclic shifters 810 and 816 of FIG. 8. Reconfigurable cyclic shifter 1400 may be configured as (i) a 72-by-72 five-bit cyclic shifter in five-bit precision mode that shifts 72 five-bit messages (i.e., 72 messages×5 bits/message=360 bits) per clock cycle or (ii) a 72-by-72 ten-bit cyclic shifter in ten-bit precision mode that shifts 36 ten-bit messages (i.e., 36 messages×10 bits/message=360 bits) per clock cycle. Thus, in both modes, reconfigurable cyclic shifter 1400 is capable of providing 72 degrees of shifting.

In five-bit precision mode, five-bit message reordering block 1404 receives 360 bits A[359:0] per clock cycle corresponding to 72 five-bit messages. The messages in each set of 72 five-bit messages are reordered by five-bit message reordering block 1404 as discussed below in relation to FIG. 15 to generate 360 bits B[359:0] corresponding to 72 five-bit reordered messages, which are split by message separator 1406 as discussed below in relation to FIG. 17 into 180 bits D[179:0] corresponding to a first subset of 36 five-bit reordered messages and 180 bits E[179:0] corresponding to a second subset of 36 five-bit reordered messages.

The first and second subsets of reordered messages are cyclically shifted by 36-by-36 five-bit cyclic shifters 1410 and 1408, respectively, to generate 180 bits F[179:0] corresponding to a first subset of 36 cyclically-shifted, five-bit messages and 180 bits G[179:0] corresponding to a second subset of 36 cyclically-shifted, five-bit messages, respectively. Cyclic shifters 1410 and 1408 may each be implemented in a manner similar to that of cyclic shifter 300 of FIG. 3. However, rather than performing 72 degrees of shifting, each cyclic shifter 1410 and 1408 provides only 36 degrees of shifting. For reconfigurable cyclic shifters 810(0), ..., 810(3) of FIG. 8, cyclic shifters 1410 and 1408 may be implemented to perform, for example, cyclic up-shifting, and for reconfigurable cyclic shifters 816(0), ..., 816(3), cyclic shifters 1410 and 1408 may be implemented to perform, for example, cyclic down-shifting. Note that cyclic shifters 1410 and 1408 together, without any additional hardware, do not perform 72 degrees of cyclic shifting. Five-bit message reordering block 1404 and message separator 1406 are employed to enable reconfigurable cyclic shifter 1400 to perform up to 72 degrees of cyclic shifting.

The first and second subsets of cyclically-shifted messages F[179:0] and G[179:0] are provided in serial to output message reordering block 1412 as one set of cyclically-shifted messages H[359:0], and output message reordering block 1412 outputs cyclically-shifted messages 1[359:0] as discussed below in relation to FIG. 18. Note that, in five-bit precision mode, output message reordering block 1412 does not reorder the set of cyclically-shifted messages H[359:0]. Rather, the set of cyclically-shifted messages H[359:0] are output in the order in which they were received.

In ten-bit precision mode, ten-bit message reordering block 1402 receives 72 ten-bit messages (i.e., 720 bits A[719:0]) every two clock cycles. Ten-bit message reordering block 1402 reorders each set of 72 ten-bit messages as discussed below in relation to FIG. 16, and outputs first and seconds sets of 36 ten-bit reordered messages at a rate of one set (i.e., 360 bits C[359:0]) per clock cycle.

Message separator 1406 splits each set of 36 ten-bit reordered messages as discussed below in relation to FIG. 17 into (i) 180 bits D[179:0] corresponding to a first set of 36 five-bit reordered sub-messages that comprises the first five bits of each of the 36 ten-bit reordered messages from ten-bit message reordering block 1402 and (ii) 180 bits E[179:0] corresponding to a second set of five-bit reordered sub-messages that comprises the second five bits of each of the 36 ten-bit reordered messages from ten-bit message reordering block 1402.

The first and second sets of five-bit reordered sub-messages are cyclically shifted by 36-by-36 five-bit cyclic shifters 1410 and 1408, respectively, to generate 180 bits F[179:0] corresponding to a first set of 36 cyclically-shifted, five-bit sub-messages and 180 bits G[179:0] corresponding to a second set of 36 cyclically-shifted, five-bit sub-messages, respectively. The first and second sets of cyclically-shifted, five-bit sub-messages F[179:0] and G[179:0] are provided in serial to output message reordering block 1412 as one set of cyclically-shifted, five-bit sub-messages H[359:0]. Output message reordering block 1412 reorders the cyclically-shifted, five-bit sub-messages H[359:0] as discussed below in relation to FIG. 18 to reassemble the ten-bit messages that were split by message separator 1406, and outputs 36 cyclically-shifted, ten-bit messages I[H359:0]. The full set of 72 cyclically-shifted, ten-bit messages is generated over two clock cycles.

Figure 15:
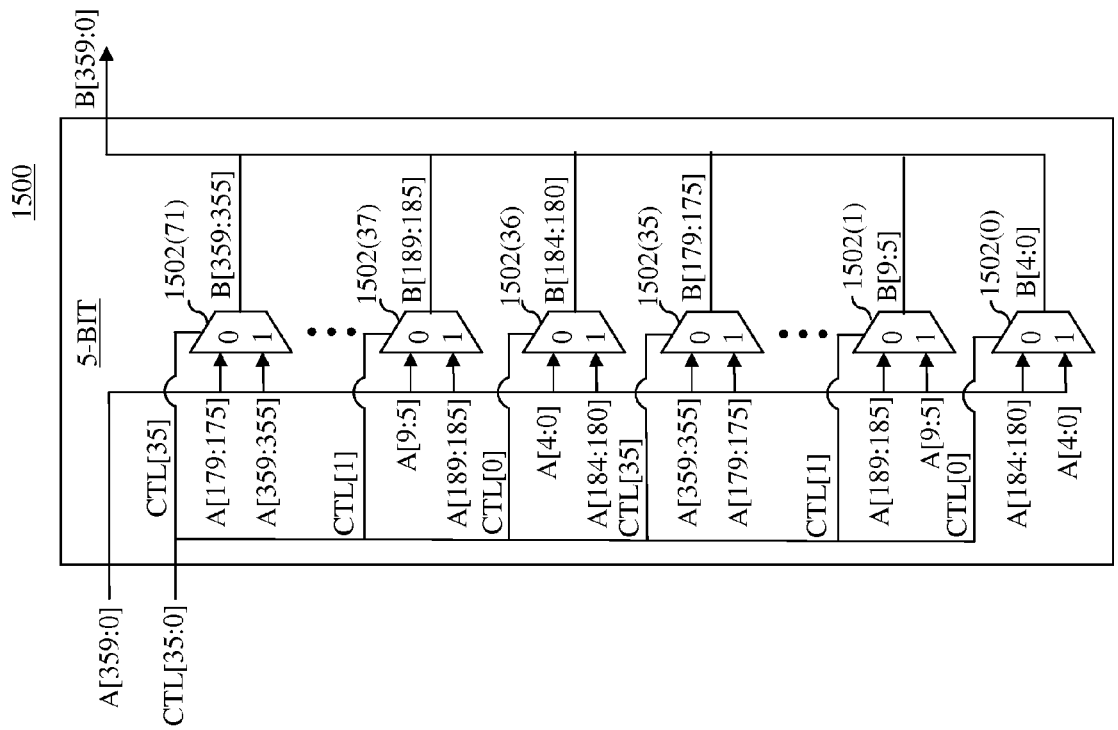
FIG. 15 shows a simplified block diagram of a five-bit message reordering block according to one embodiment of the present invention that may be used to implement the five-bit message reordering block of the reconfigurable cyclic shifter of FIG. 14.

FIG. 15 shows a simplified block diagram of a five-bit message reordering block 1500 according to one embodiment of the present invention that may be used to implement five-bit message reordering block 1404 of reconfigurable cyclic shifter 1400 of FIG. 14. Five-bit message reordering block 1500 receives 360 bits A[359:0] corresponding to 72 five-bit messages. The 72 five-bit messages are provided to multiplexers 1502(0), ..., 1502(71), such that (i) the lower inputs of multiplexers 1502(0), ..., 1502(71) receive messages A[4:0], ..., A[359:355], respectively, (ii) the upper inputs of multiplexers 1502(0), ..., 1502(35) receive messages A[184:180]), ..., A[359:355]), respectively, and (iii) the upper inputs of multiplexers 1502(36), ..., 1502(71) receive messages A[4:0], ..., A[179:175]), respectively.

Multiplexers 1502(0), ..., 1502(71) select either their respective upper or lower inputs to output as reordered five-bit messages B[4:0], ..., B[359:355], respectively, based on a 36-bit control signal (CTL[35:0]). The inputs may be selected such that all upper inputs, all lower inputs, or a combination of upper and lower inputs are output. Control signal (CTL[35:0]), which may be supplied from a controller such as controller 818 of FIG. 8 and which may be generated based on a desired cyclic shift, is provided such that multiplexers 1502(0), ..., (35) receive CTL[0], ..., CTL[35], respectively, and multiplexers 1502(36), ..., 1502(71) also receive CTL[0], ..., CTL[35], respectively.

Figure 16:
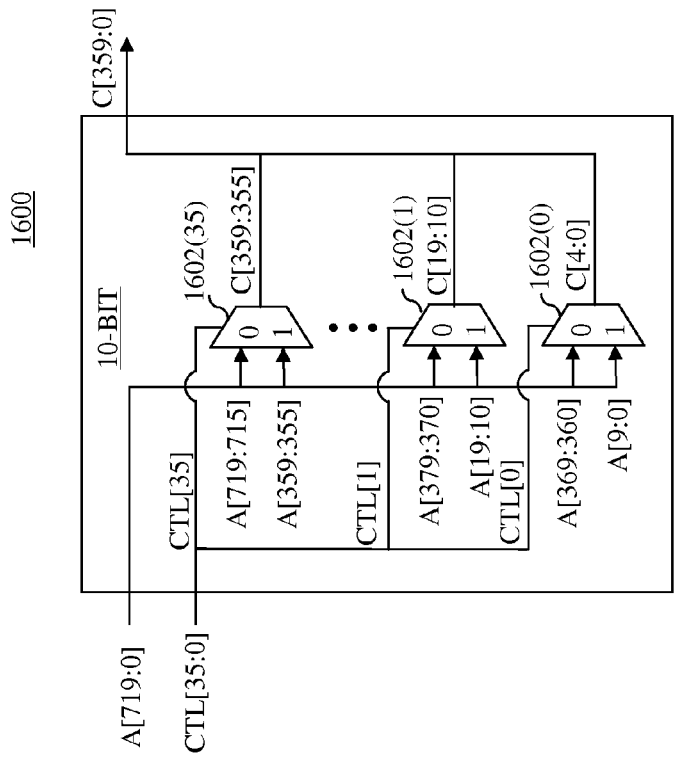
FIG. 16 shows a simplified block diagram of a ten-bit message reordering block according to one embodiment of the present invention that may be used to implement the ten-bit message reordering block of the reconfigurable cyclic shifter of FIG. 14.

FIG. 16 shows a simplified block diagram of a ten-bit message reordering block 1600 according to one embodiment of the present invention that may be used to implement ten-bit message reordering block 1402 of reconfigurable cyclic shifter 1400 of FIG. 14. Ten-bit message reordering block 1600 receives 720 bits A[719:0] corresponding to 72 ten-bit messages every two clock cycles. The ten-bit messages are provided to multiplexers 1602(0), ..., 1602(35), such that (i) the lower inputs of multiplexers 1602(0), ..., 1602(35) receive the first 36 ten-bit messages A[9:0], ..., A[359:355], respectively, and (ii) the upper inputs of multiplexers 1602(0), ..., 1602(35) receive the second 36 ten-bit messages A[369:360]), ..., A[719:715], respectively. The 72 ten-bit messages are output over two clock cycles, such that 36 ten-bit messages are output during each of the two clock cycles. During the first of the two clock cycles, multiplexers 1602(0), ..., 1602(35) select either their respective upper or lower inputs to output as reordered ten-bit messages C[9:0], ..., C[359:350], respectively. Similar to five-bit reordering block 1500 of FIG. 15, the inputs may be selected such that all upper inputs, all lower inputs, or a combination of upper and lower inputs are output. During the second of the two clock cycles, the inputs of multiplexers 1602(0), ..., 1602(35) that were not selected during the first clock cycle are output as reordered ten-bit messages C[9:0], ..., C[359:350], respectively. Selection of outputs is based on 36-bit control signal CTL[35:0], which is provided such that multiplexers 1602(0), ..., 1602(35) receive CTL[0], ..., CTL[35], respectively.

FIG. 17 shows a simplified block diagram of a message separator 1700 according to one embodiment of the present invention that may be used to implement message separator 1406 of reconfigurable cyclic shifter 1400 of FIG. 14. Message separator 1406 has multiplexer 1702, which receives 72 five-bit messages B[359:0] via its lower input and 36 ten-bit messages C[359:0] via its upper input.

In five-bit precision mode, control signal 1006 is set to 1, and the 72 five-bit messages B[359:0] are output in alternating fashion to cyclic shifters 1410 and 1408 of FIG. 14. In particular, five-bit messages B[4:0], B[14:10], ..., B[354:350] are provided as D[179:0] to cyclic shifter 1410 of FIG. 14, and five-bit messages B[9:5], B[19:15], ..., B[359:355] are provided as E[179:0] to cyclic shifter 1408.

In ten-bit mode, control signal 1006 is set to 0, and the 36 ten-bit messages C[359:0] are output such that the first five bits of each ten-bit message (C[4:0], C[14:10], ..., C[354:350]) are provided to cyclic shifter 1410 as D[179:0], and the second five bits of each ten-bit message (C[9:5], C[19:15], C[359:355]) are provided to cyclic shifter 1408 as E[179:0].

FIG. 18 shows a simplified block diagram of an output message reordering block 1800 according to one embodiment of the present invention that may be used to implement output message reordering block 1412 of reconfigurable cyclic shifter 1400 of FIG. 14. Output message reordering block 1800 receives 360 bits H[359:0] (i.e., 72 five-bit messages in five-bit precision mode or 36 ten-bit messages in ten-bit mode). The first five bits H[4:0] and the last five bits H[359:355] are provided to the output as I[4:0] and I[359:355], respectively. The remaining 350 bits H[354:5] are provided to (i) the lower input of multiplexer 1802 in the order in which they are received and (ii) the upper input of multiplexer 1802, such that groups of five bits from the first 175 bits H[179:5] are interleaved with groups of five bits from the second 175 bits H[354:180]. For example, bits H[184:180] are provided to multiplexer 1802, followed by bits H[9:5], followed by bits H[189:185], followed by bits H[14:10], and so on.

In five-bit precision mode, control signal 1006 is set to 1 such that the lower input H[354:5] of multiplexer 1802, which comprises 70 five-bit messages I[354:5], is output. The 70 five-bit messages I[354:5] are output with five-bit messages I[4:0] and I[359:355] such that the 72 five-bit messages are output as I[359:0].

In ten-bit precision mode, control signal 1006 is set to 0, such that the upper input of multiplexer 1802 is output. The upper input of multiplexer 1802, which comprises (i) 34 ten-bit messages I[349:10], (ii) a second half I[9:5] of the first ten-bit message, and (iii) a first half I[350:354] of the last ten-bit message is output with the first half I[4:0] of the first ten-bit message and the second half I[359:355] of the last ten-bit message, such that the 36 ten-bit messages are output as I[359:0]. Note that, in ten-bit precision mode, the 360 bits H[359:0] received by output message permutator 1800 are interleaved to reassemble the ten-bit messages, each of which was divided into two five-bit sub-messages by message separator 1406 of FIG. 14.

Timing for Reconfigurable LDPC Decoder 800

Figure 19:
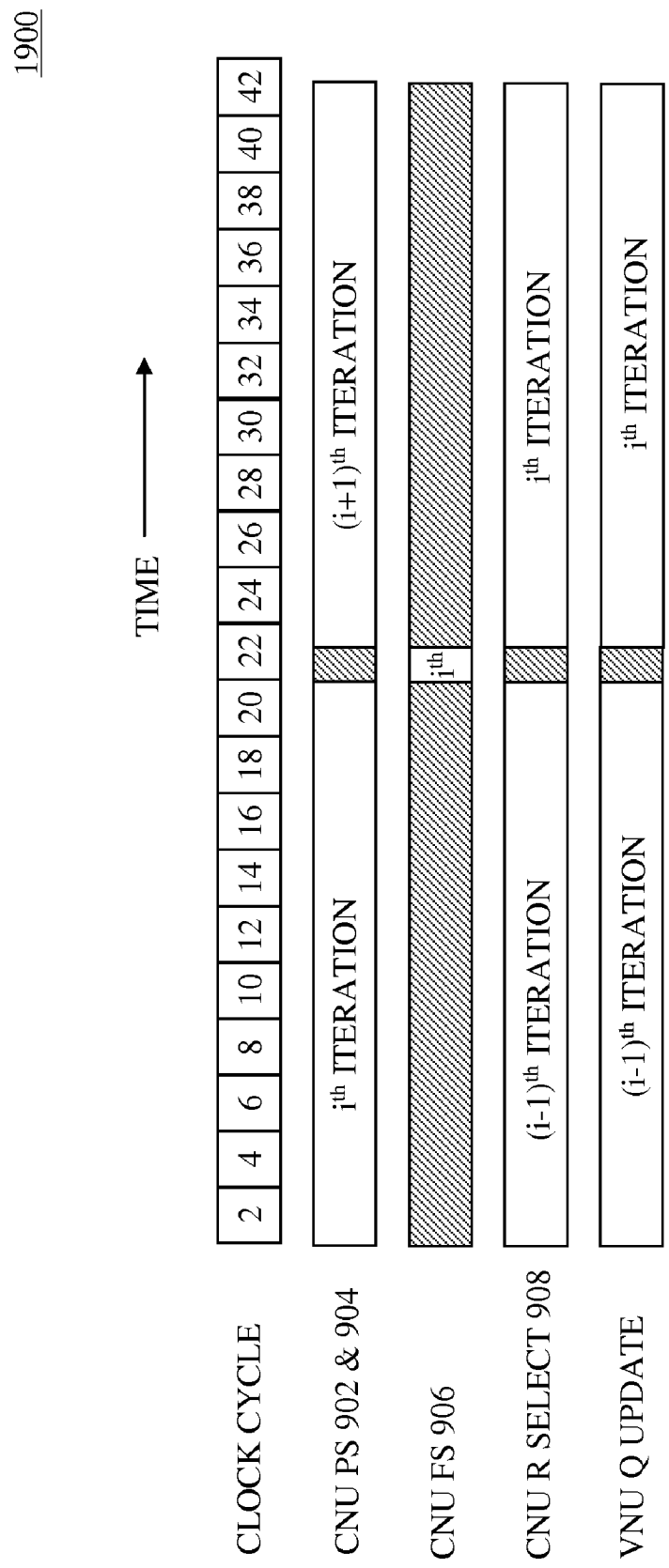
FIG. 19 graphically illustrates a timing diagram for the ten-bit precision mode of the LDPC decoder of FIG. 8.

FIG. 19 graphically illustrates a timing diagram 1900 for the ten-bit precision mode of reconfigurable LDPC decoder 800 of FIG. 8. Suppose, for this diagram, that reconfigurable LDPC decoder 800 implements reconfigurable CNUs such as reconfigurable CNU 900 of FIG. 9. As shown, for the ith iteration, each reconfigurable CNU 900 performs partial state (PS) processing 904 during the first twenty clock cycles to generate and store minimum magnitude values M1(1) and M1(2) and second minimum magnitude values M2(1) and M2(2). During the 21st clock cycle, each reconfigurable CNU 900 transfers the minimum and second minimum magnitude values to final state (FS) memory 906. During the 22nd to 41st clock cycles, R selector processing 908 of each reconfigurable CNU 900 selects the updated ten-bit R messages and outputs the ten-bit R messages to reconfigurable VNU array 804, which generates the updated ten-bit Q messages during the same 20 clock cycles. Note that, for simplicity, the delays of reconfigurable cyclic shifters 810(0), . . . , 810(3), reconfigurable cyclic shifters 816(0), . . . , 816(3), buffers 814(0), . . . , 814(3), and buffers 808(0), . . . , 808(3) are not shown. Buffers 814(0), . . . , 814(3), together, may add a add a total delay of approximately one clock cycle, and similarly, buffers 814(0), . . . , 814(3), together, may add a add a total delay of approximately one clock cycle. Further, note that, since partial state (PS) processing 904 and R selection processing 908 of each reconfigurable CNU 900 are performed over separate clock cycles, each reconfigurable CNU 900 may process two different iterations at the same time. For example, during the $22^{nd}$ to $41^{st}$ clock cycles, while each reconfigurable CNU 900 is selecting and outputting the updated ten-bit R messages for the $i^{th}$ iteration, the CNU may also be performing partial state (PS) processing 904 for the $(i+1)^{th}$ iteration.

CONCLUSION

Although the present invention has been described relative to the specific non-layered reconfigurable LDPC decoder configuration 800 of FIG. 8, the present invention is not so limited. Various embodiments of the present invention may also be envisioned for other LDPC decoder structures that employ message passing. For example, reconfigurable LDPC decoders of the present invention may be implemented without using cyclic shifters. In such embodiments, the messages may be passed between CNUs and VNUs through direct connections or using permutators that perform non-cyclic shifting. Further, the present invention may be implemented for other non-layered or layered decoder structures such that these other structures may be reconfigured in real time to process five-bit and ten-bit messages. In some reconfigurable LDPC decoder structures of the present invention, such as reconfigurable layered decoder structures, the reconfigurable LDPC decoder might not implement a separate reconfigurable VNU such as that described above in relation to reconfigurable adder 1300 of FIG. 13. Instead, the reconfigurable LDPC decoder might generate Q messages using one or more reconfigurable adders that are not grouped together as one identifiable reconfigurable VNU.

Further, although the present invention was described relative to the specific H-matrix 100 of FIG. 1, the present invention is not so limited. The present invention may be implemented for various H-matrices that are the same size or a different size than matrix 100 of FIG. 1. Such matrices may be, for example, cyclic, quasi-cyclic, non-cyclic, regular, or irregular H-matrices. In embodiments that are used to implement H-matrices that are a different size than H-matrix 100, the number of VNUs, fixed and adjustable permutators, and CNUs may vary according to the size of the H-matrix.

Yet further, although the specific embodiments of processing of LDPC decoder 800 were discussed (e.g., reconfigurable CNU 900 of FIG. 9, reconfigurable 2TM converter 1000 of FIG. 10, reconfigurable minimum operator 1200 of FIG. 12, reconfigurable adder 1300 of FIG. 13, reconfigurable cyclic shifter 1400 of FIG. 14), the present invention is not limited to embodiments that implement these reconfigurable components. Further embodiments of these and other reconfigurable components may be envisioned by one of ordinary skill in the art.

It will be further understood that various changes in the details, materials, and arrangements of the parts which have been described and illustrated in order to explain the nature of this invention may be made by those skilled in the art without departing from the scope of the invention as expressed in the following claims. For example, rather than receiving Q messages and outputting R messages using two's-complement format, CNU 900 may receive and output messages in another format such as sign-magnitude format. In such a case, two's-complement-to-sign-magnitude conversion may be performed by, for example, the VNUs. As another example, LDPC decoders of the present invention may process messages of sizes other than five and ten bits. Such embodiments may process messages of other sizes having a two-to-one ratio, such as four and eight bits, or messages of other sizes having a ratio N other than two-to-one.

Although embodiments of the present invention have been described in the context of LDPC codes, the present invention is not so limited. Embodiments of the present invention could be implemented for any code that can be defined by a graph, e.g., tornado codes and structured IRA codes, since graph-defined codes suffer from trapping sets.

Further, although the exemplary belief-propagation algorithm used above is the offset min-sum algorithm (OMS), the present invention is not so limited, and can be used with any suitable belief-propagation variant, e.g., sum-product algorithm (SPA) or the Bahl-Cocke-Jelinek-Raviv (BCJR) algorithm.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. A node unit of a reconfigurable error-correction decoder comprising a reconfigurable adder, wherein:
the reconfigurable adder is adapted to receive a first set of bits and a second set of bits;
the reconfigurable adder comprises:
a first non-reconfigurable adder adapted to add (i) a first operand comprising a first subset of the first set of bits and (ii) a second operand comprising a first subset of the second set of bits to generate a first sum;
logic circuitry adapted to receive (i) a mode control signal and (ii) a most significant bit of the first sum and generate an intermediate value; and
a second non-reconfigurable adder adapted to add (i) a third operand comprising a second subset of the first set of bits, (ii) a fourth operand comprising a second subset of the second set of bits, and (iii) the intermediate value to generate a second sum;
the reconfigurable adder is selectively configurable to operate in a first operating mode to add multi-bit values in a pair of multi-bit values, in which each multi-bit value has a first number of bits; and
the reconfigurable adder is selectively configurable to operate in a second operating mode to add multi-bit values in a pair of multi-bit values, in which each multi-bit value has a second number of bits different from the first number of bits.

2. The node unit of claim 1, wherein:
in the first operating mode:
the first, second, third, and fourth operands correspond to first, second, third, and fourth multi-bit values, respectively;
the first sum is a sum of the first and second multi-bit values;
the second sum is a sum of the third and fourth multi-bit values; and
the intermediate value is zero; and
in the second operating mode:
the first and third operands correspond to a first multi-bit value;
the second and fourth operands correspond to a second multi-bit value;
the first sum corresponds to least significant bits of a sum of the first and second multi-bit values;
the second sum corresponds to most significant bits of the sum of the first and second multi-bit values; and
the intermediate value is the most significant bit of the first sum.

3. The node unit of claim 1, wherein the logic circuitry comprises an AND gate adapted to implement logical conjunction, based on a mode control signal and the most significant bit of the first sum, to generate the intermediate value as a carry-over bit.

4. The node unit of claim 1, wherein:
in the first operating mode, the error-correction decoder is configured to process messages having the first number of bits; and
in the second operating mode, the error-correction decoder is configured to process messages having the second number of bits.

5. The node unit of claim 1, wherein:
in the first operating mode, the node unit combines messages having the first number of bits; and
in the second operating mode, the node unit combines messages having the second number of bits.

6. The node unit of claim 1, wherein the node unit is implemented in an integrated circuit.

7. The node unit of claim 1, wherein the reconfigurable adder comprises hardware that is used in both the first and second operating modes.

8. The node unit of claim 7, wherein the reconfigurable adder comprises hardware that is needed in the second operating mode but not the first operating mode.

9. The node unit of claim 1, wherein the reconfigurable error-correction decoder is a low-density parity-check decoder.

10. The apparatus node unit of claim 9, wherein the node unit is a variable-node unit.

11. The node unit of claim 1, wherein:
the second number of bits is an integer multiple M of the first number of bits; and
in the first operating mode, the reconfigurable adder is adapted to add multi-bit values concurrently in M times as many pairs of multi-bit values as in the second operating mode.

12. The node unit of claim 11, wherein M=2.

13. The node unit of claim 1, wherein each multi-bit value is a message comprising a hard-decision bit and at least one confidence value bit.

14. An error-correction decoder comprising a reconfigurable adder, wherein:
the reconfigurable adder is selectively configurable to operate in a first operating mode to add multi-bit values in a pair of multi-bit values, in which each multi-bit value has a first number of bits; and
the reconfigurable adder is selectively configurable to operate in a second operating mode to add multi-bit values in a pair of multi-bit values, in which each multi-bit value has a second number of bits different from the first number of bits.

15. The error-correction decoder of claim 14, wherein:
in the first operating mode, the error-correction decoder is configured to process messages having the first number of bits; and
in the second operating mode, the error-correction decoder is configured to process messages having the second number of bits.

16. The error-correction decoder of claim 14 comprising a node unit, wherein:
the node unit comprises the reconfigurable adder;
in the first operating mode, the node unit combines messages having the first number of bits; and
in the second operating mode, the node unit combines messages having the second number of bits.

17. The error-correction decoder of claim 14, wherein the error-correction decoder is a low-density parity-check decoder.

18. The error-correction decoder of claim 14, wherein the error-correction decoder is implemented in an integrated circuit.

19. The error-correction decoder of claim 14, wherein:
the second number of bits is an integer multiple M of the first number of bits; and
in the first operating mode, the reconfigurable adder is adapted to add multi-bit values concurrently in M times as many pairs of multi-bit values as in the second operating mode.

20. The error-correction decoder of claim 19, wherein M=2.

* * * * *

UNITED STATES PATENT AND TRADEMARK OFFICE
CERTIFICATE OF CORRECTION

PATENT NO. : 8,407,567 B2
APPLICATION NO. : 12/492328
DATED : March 26, 2013
INVENTOR(S) : Kiran Gunnam It is certified that error appears in the above-identified patent and that said Letters Patent is hereby corrected as shown below:

In the Claims

In column 32, line 66-67, please replace "The apparatus node unit of claim 9, wherein the node unit is a variable-node unit." with --The node unit of claim 9, wherein the node unit is a variable-node unit.--

Signed and Sealed this
Fourth Day of June, 2013

Teresa Stanek Rea
*Acting Director of the United States Patent and Trademark Office*